United States Patent [19]
Maeda et al.

[11] Patent Number: 5,808,341
[45] Date of Patent: Sep. 15, 1998

[54] SEMICONDUCTOR DEVICE HAVING AN SOI STRUCTURE

[75] Inventors: Shigenobu Maeda; Yasuo Yamaguchi; Il Jung Kim; Yasuo Inoue; Shigeto Maegawa; Takashi Ipposhi, all of Tokyo, Japan

[73] Assignee: Mitsubishi Denki Kabushiki Kaisha, Tokyo, Japan

[21] Appl. No.: 747,933

[22] Filed: Nov. 12, 1996

[30] Foreign Application Priority Data

Jun. 7, 1996 [JP] Japan ..................... 8-145621

[51] Int. Cl.$^6$ ..................... H01L 29/00
[52] U.S. Cl. ............ 257/349; 257/347; 257/350; 257/351; 257/366; 257/369; 257/409
[58] Field of Search ............ 257/347, 351, 257/366, 369, 349, 350, 409

[56] References Cited

U.S. PATENT DOCUMENTS 5,592,009  1/1997  Hidaka ..................... 257/351
5,633,524  5/1997  Ueda et al. ..................... 257/369
5,635,744  6/1997  Hidaka et al. ..................... 257/349

OTHER PUBLICATIONS

T. Iwamatsu, et al. "CAD–Compatible High Speed CMOS/SIMOX Technology Using Field–Shield isolation for 1M Gate Array", Proc IEEE IEDM Tech. Digest, (pp. 475–478), Dec. 5–8, 1993.

T. Iwamatsu, et al. "High–Speed 0.5$\mu$m SOI 1/8 Frequency Divider with Body–Fixed Structure for Wide Range of Applications", Extended Abstracts of the 1995 International Conference on Solid State Devices and Materials, (pp. 575–577), Osaka 1995.

*Primary Examiner*—Valencia Wallace
*Attorney, Agent, or Firm*—Oblon, Spivak, McClelland, Maier, & Neustadt, P.C.

[57] ABSTRACT

FS-isolated fields (10a, 10b), LOCOS-isolated fields (11c, 11d), FS-isolated fields (10e, 10f), LOCOS-isolated field (11g, 11h) and FS-isolated field (10i) are arranged in this order. Thus, a master layout can be provided, where SOI transistors having bodies to be supplied with fixed potential and those having bodies not to be supplied with fixed potential are mixed.

22 Claims, 33 Drawing Sheets

F I G. 1 4
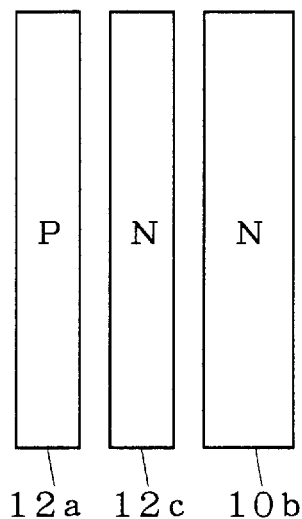
F I G. 1 5
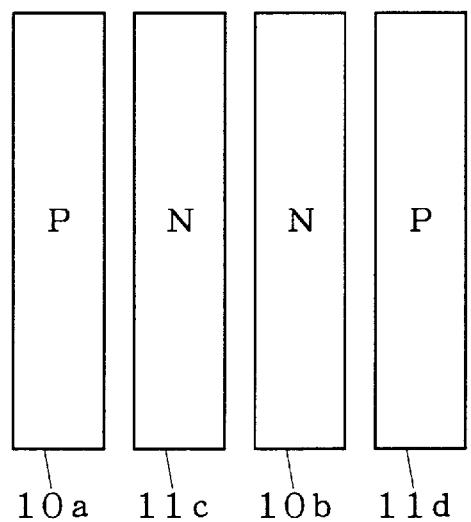

NMOS TRANSISTOR

PMOS TRANSISTOR

SEMICONDUCTOR DEVICE HAVING AN SOI STRUCTURE

BACKGROUND OF THE INVENTION

1. Field of the Invention

The present invention relates to a semiconductor device, and more particularly to a transistor using an SOI (Semiconductor On Insulator) substrate.

2. Description of the Background Art

An ASIC (Application Specific Integrated Circuit) is desired to operate at high speed with low power consumption, like a logic LSI such as a microprocessor, and so is a gate array which is a form of the ASIC.

FIG. 36 is a cross section showing a structure of a bulk NMOS transistor. A junction capacitance C1 caused by a depletion layer 104 existing between an Si substrate 101 and a source region 102 (or a drain region 103) is large and a wiring capacitance C2 between a metal wire 105 disposed on an NMOS transistor and the Si substrate 101 through a LOCOS oxide film 108 is also large.

In this situation, proposed is a use of an SOI layer in a gate array. FIG. 37 is a cross section showing a structure of an SOI NMOS transistor. Since a transistor on an SOI layer 106 has a thick buried oxide film 107 thereunder, both the junction capacitance C1 and the wiring capacitance C2 thereof are smaller than those of the bulk NMOS transistor. That allows higher-speed operation and lower power consumption.

Moreover, a transistor of which the source and drain are formed in the SOI layer 106 (referred to as "SOI transistor" hereinafter) has a semiconductor (body) 110 which is in an electrically-floating state between a source region 102 and a drain region 103. A "body effect", which refers to an action that a threshold value Vth of the transistor rises due to a potential difference between the Si substrate 101 and the source region 102 when a source potential rises (in case of an NMOS transistor), is not caused in the SOI transistor unlike the bulk transistor. Therefore, the SOI transistor may be always used with a small threshold value and operate with low voltage. Thus, the SOI transistor needs only low power consumption.

In the SOI transistor, however, when the source-to-drain voltage reaches a certain level or more, impact-ionized charges near the drain region 103, e.g., positive holes in the NMOS transistor, do not escape into the Si substrate 101 to raise a potential at the body 110 which acts as a base of an NPN type parasitic bipolar transistor consisting of the body 101, the source region 102 and the drain region 103 since the body 101 where a channel is formed is in the floating state. Then, a current driven by the bipolar transistor is superposed on an original current of the SOI transistor. FIG. 38 is a graph showing a rise in current due to a parasitic bipolar effect. To avoid the parasitic bipolar effect, it is needed to fix the potential at the body 110 of the SOI transistor.

FIG. 39 is a plan view of a structure of field-shield isolation (referred to as "FS isolation" or "FS-isolated structure" hereinafter). FIGS. 40 and 41 are cross sections of FIG. 39 taken along the lines XXXX—XXXX, and XXXXI—XXXXI, respectively. An active region 111 having a width Lf is formed to become the source region 102 or the drain region 103. The active region 111 is provided with a source-drain contact 96 to establish an electrical connection with a wire (not shown). For simple illustration, a gate contact 97 of a gate electrode 109 is not shown in FIG. 39.

Similarly to a gate isolation by fixing a potential of the gate electrode 109 (e.g., by connecting the gate electrode 109 to the ground GND through the gate contact 97 in a case of NMOS transistor) made in a direction of arrangement of the active region 111 (in vertical direction of FIG. 39), the FS isolation is a device isolation with an FS gate 91 achieved in a direction perpendicular to the vertical direction (in a horizontal direction of FIG. 39).

Specifically, the FS gate 91, like the gate electrode 109, is opposed to the SOI layer 106 with an insulative interlayer film interposed therebetween on both sides of the NMOS transistor, and when it is connected to the ground GND, the NMOS transistor is isolated in the horizontal direction.

FIG. 42 is a cross section showing an isolation using a LOCOS oxide film (referred to as "LOCOS isolation" hereinafter) in the horizontal direction. When the LOCOS isolation is used, the SOI layer 106 is separated in the horizontal direction by the LOCOS oxide film 108 and hence it is impossible to provide a contact for supplying the SOI layer 106 with a predetermined potential. In contrast, when the FS isolation is used, the SOI layer 106 can extend also in the horizontal direction and hence it is possible to supply the SOI layer 106 with the predetermined fixed potential in the extension of the SOI layer 106. In this case, it is necessary to provide an FS gate contact 92 for supplying the FS gate 91 with the predetermined potential and a contact plug 93 for FS isolation as shown in FIG. 41, and on the other hand, it is necessary to provide a body contact 94 for supplying the body with the predetermined potential and the contact plug 93 (a region indicated by hatching can have higher impurity concentration in the SOI layer 106 with which the contact plug 93 comes into contact). Therefore, there is a need for a chipped portion 95 at a position to provide the body contact 94 in the FS gate 91, as shown in FIGS. 39 and 40.

This gate array, which supplies the body 110 with the predetermined potential, allows reduction in wiring capacitance, ensures high-speed operation and low power consumption and further prevents the parasitic bipolar effect. For example, the SOI transistor with FS-isolated structure may be used in an inverter.

FIG. 43A shows a symbol of an inverter and FIG. 43B shows a specific configuration thereof. The inverter consists of a PMOS transistor P1 and an NMOS transistor N1 connected in series between a potential point supplying a potential Vcc and the ground GND. Specifically, the source of PMOS transistor P1 is fixed to the potential Vcc and the source of NMOS transistor N1 is fixed to the ground potential GND. In this configuration, even if the SOI transistors with FS-isolated structure are used as the transistors P1 and N1 and the bodies of the transistors P1 and N1 are fixed to the potential Vcc and the ground potential GND, respectively, no potential difference exists between the respective bodies and sources and hence no body effect works ill on the inverter.

However, there may be a case where it is preferable not to fix the potential at the body 110 so as not to lose the advantage of no body effect.

FIG. 44A shows a symbol of an NAND circuit and FIG. 44B shows a specific configuration thereof. The NAND circuit consists of PMOS transistors P1 and P2 connected in parallel and NMOS transistors N1 and N2 connected in series between the potential point supplying the potential Vcc and the ground GND.

Since the sources of transistors P1, P2 and N2 are supplied with the potential Vcc, Vcc and the ground potential GND respectively, if the bodies of the transistors P1, P2 and N2 are supplied with the potential Vcc, Vcc and the ground potential GND respectively, no body effect is produced on the transistors. However, there may be a case where a potential higher than the ground potential GND is applied to the source of the transistor N1 which is not supplied with a fixed potential, and when the ground potential GND is applied to the body of the transistor N1, a threshold voltage rises due to the body effect. In this situation, the NAND circuit can not operate with low voltage and hardly avoids slow operation.

FIG. 45 shows a layout where vertical alignments of the active regions (referred to as "fields" hereinafter) are arranged in the horizontal direction (this layout is referred to as "master layout" hereinafter). As illustrated in disregard of the gate electrodes, the fields 10a to 10i are seen rectangular. The characters "P" and "N" in rectangles indicate fields to be provided with the PMOS transistor and the NMOS transistor, respectively. The fields provided with the PMOS transistor and the NMOS transistor are herein termed "p-type field" and "In-type field", respectively.

In the background art, when the FS isolation is used to supply the body 110 with the predetermined potential, all of the fields are FS-isolated (the fields 10a to 10i of FIG. 45 are each FS-isolated, and the field with FS-isolated structure is referred to as "FS-isolated field" hereinafter). Since the SOI layers 106 in a field are supplied with the predetermined potential in common (e.g., the ground potential GND in the NMOS transistor), the potentials at the bodies 110 of the transistors in the same field are all fixed. Then, there arises a problem of degradation in high-speed operation of the SOI transistor in a circuit including a transistor having the source which is not supplied with the fixed potential, such as an NAND circuit.

Furthermore, by supplying the gate electrode and the body with the same potential, it may become possible to positively utilize the parasitic bipolar effect to earn a driving current of the SOI transistor.

SUMMARY OF THE INVENTION

The present invention is directed to a semiconductor device. According to a first aspect of the present invention, the semiconductor device comprises: at least one first-type field extending in a first direction; and at least one second-type field extending in the first direction. In the semiconductor device of the first aspect, the first-type field and the second-type field constitute a gate array in which SOI transistors are provided, the first-type field supplies bodies of the SOI transistors with a fixed potential, the second-type field brings the bodies of the SOI transistors into a floating state, and the first-type field and the second-type field are arranged along a second direction which is different from the first direction.

Preferably, the first-type field is isolated using a field-shield isolation.

According to a second aspect of the present invention, in the semiconductor device of the first aspect, a pair of the first-type fields which are different in conductivity type from each other and the second-type field located therebetween are arranged as a set.

According to a third aspect of the present invention, in the semiconductor device of the first aspect, a PMOS transistor is provided only in the second-type field and an NMOS transistor is provided both in the first-type field and in the second-type field.

According to a fourth aspect of the present invention, in the semiconductor device of the first, second or third aspect, the second-type field is narrower than the first-type field.

According to a fifth aspect of the present invention, in the semiconductor device of the first aspect, the first-type field and the second-type field are alternately arranged while the first-type field and the second-type field which are of the same conductivity type are adjacently arranged.

According to a sixth aspect of the present invention, the gate array consists of a plurality of clusters, each of the plurality of clusters includes a first subarray having the first-type field and the second-type field, and a second subarray having only the first-type field, and the first subarray is different from the second subarray in length in the first direction.

According to a seventh aspect of the present invention, a semiconductor device comprises: an SOI layer having a first portion extending in a first direction and a plurality of second portions which is extending from the first portion and disposed discretely in a second direction which is different from the first direction; gate electrodes each having an end portion which covers part of the second portions in the first direction and a main portion which extends from the end portion and covers part of the first portion in the second direction; bodies each of a first conductivity type provided in the first portion which is covered with the main portion; and active regions each of a second conductivity type provided in the first portion which is not covered with the main portion. In the semiconductor device of the sixth aspect, a pair of the active regions and one of the gate electrodes constitute an SOI transistor.

According to an eighth aspect of the present invention, a semiconductor device comprises: an SOI layer having a first portion extending in a first direction and a plurality of second portions which is extending from the first portion and disposed discretely in a second direction which is different from the first direction; gate electrodes each having a main portion which covers part of the first portion in the second direction; bodies each of a first conductivity type provided in the first portion which is covered with the main portion; active regions each of a second conductivity type provided in the first portion which is not covered with the main portion; and isolation electrodes covering part of the second portions in the first direction while being insulated between the SOI layer and the gate electrodes from one another. In the semiconductor device of the seventh aspect, a pair of the active regions and one of the gate electrodes constitute an SOI transistor.

According to a ninth aspect of the present invention, a semiconductor device comprises: SOI layers disposed discretely in a first direction, each having a first portion and a second portion which are contiguous in a second direction different from the first direction; gate electrodes each having a main portion which covers part of the first portion in the second direction; bodies each of a first conductivity type provided in the first portion which is covered with the main portion; active regions each of a second conductivity type provided in the first portion which is not covered with the main portion; and an isolation electrode covering part of the second portion in the first direction while being insulated between the SOI layers and the gate electrodes from one another. In the semiconductor device, a pair of the active regions and one of the gate electrodes constitute an SOI transistor.

According to a tenth aspect of the present invention, the semiconductor device of the seventh aspect further comprises: wires for electrically connecting the gate electrodes and the second portions provided correspondingly to the gate electrodes.

According to an eleventh aspect of the present invention, a semiconductor device comprises: an SOI layer having a first portion extending in a first direction and at least one second portion extending from the first portion in a second direction which is different from the first direction; a gate electrode having a main portion which covers part of the first portion in the second direction while being insulated therefrom and an end portion which covers part of the second portion while being insulated therefrom with an interlayer film; a body of a first conductivity type provided in the first portion which is covered with the main portion; active regions each of a second conductivity type provided in the first portion which is not covered with the main portion; and plugs each penetrating the interlayer film to come into contact with the second portion and the end portion which correspond to each other. In the semiconductor device of the tenth aspect, a pair of the active regions and the gate electrode constitute an SOI transistor.

According to a twelfth aspect of the present invention, in the semiconductor device of the eleventh aspect, the plugs come into contact with the plurality of second portions while penetrating the plurality of second portion.

According to a thirteenth aspect of the present invention, a semiconductor device comprises: an SOI layer having a first portion extending in a first direction and at least one second portion extending from the first portion in a second direction which is different from the first direction; a gate electrode having a main portion which covers part of the first portion in the second direction while being insulated therefrom and an end portion; a body of a first conductivity type provided in the first portion which is covered with the main portion; active regions each of a second conductivity type provided in the first portion which is not covered with the main portion; and plugs each coming into contact with the end portion. In the semiconductor device of the fourteenth aspect, a pair of the active regions and the gate electrode constitute an SOI transistor.

According to a fourteenth aspect of the present invention, in the semiconductor device of the thirteenth aspect, a contact region in the second portion, being in contact with the end portion, has a higher impurity concentration.

According to an fifteenth aspect of the present invention, in the semiconductor device of the thirteenth aspect, a contact region in the second portion, being in contact with the end portion, has a degraded crystallinity.

According to a sixteenth aspect of the present invention, in the semiconductor device of the thirteenth aspect, the SOI layer is determined to have the same conductivity type as a channel to be formed in the SOI transistor, and the gate electrode is formed of a semiconductor of a conductivity type which is different from that of the SOI layer.

According to a seventeenth aspect of the present invention, a semiconductor device comprises: an SOI layer having a first portion extending in a first direction and at least one second portion extending from one end of the first portion in a second direction which is different from the first direction; a gate electrode having a main portion which covers part of the first portion in the second direction while being insulated therefrom and an end portion covering the other part of the first portion; a body of a first conductivity type provided in the first portion which is covered with the main portion; and active regions each of a second conductivity type provided in the first portion which is not covered with the main portion. In the semiconductor device of the nineteenth aspect, a pair of the active regions and the gate electrode constitute an SOI transistor.

According to an eighteenth aspect of the present invention, in the semiconductor device of the seventeenth aspect, the at least one second portion is a plurality of second portions provided discretely in the first direction. The semiconductor device of the seventeenth aspect further comprises an isolation electrode covering part of the plurality of second portions in the first direction while being insulated between the SOI layer and the gate electrode from one another.

According to a nineteenth aspect of the present invention, a semiconductor device comprises: a first SOI layer having a first portion extending in a first direction and a second portion extending from one end of the first portion in a second direction which is different from the first direction; a first gate electrode having a main portion which covers part of the first portion in the second direction while being insulated therefrom and an end portion covering part of the second portion; a first body provided in the first portion which is covered with the main portion; first active regions of a first conductivity type provided in the first portion which is not covered with the main portion; a second SOI layer having a first portion extending in the first direction and a second portion extending from one end of the first portion of the second SOI layer in the second direction; a second gate electrode having a main portion which covers part of the first portion of the second SOI layer in the second direction while being insulated therefrom and an end portion covering part of the second portion of the second SOI layer; a second body provided in the first portion of the second SOI layer which is covered with the main portion of the second gate electrode; and second active regions of a second conductivity type provided in the first portion of the second SOI layer which is not covered with the main portion of the second gate electrode. In the semiconductor device of the twenty-second aspect, the second portion of the first SOI layer and the second portion of the second SOI layer are adjacently arranged, the end portion of the first gate electrode and the end portion of the second gate electrode are adjacently arranged, a pair of the first active regions and the first gate electrode constitute a first SOI transistor, a pair of the second active regions and the second gate electrode constitute a second SOI transistor, and the second portion of the first SOI layer, the second portion of the second SOI layer, the end portion of the first gate electrode and the end portion of the second gate electrode are connected in common at one portion in a plane having the first and second directions.

In the semiconductor device of the first aspect, the SOI transistor having the body to be supplied with the fixed potential and that having the body not to be supplied with the fixed potential are mixed. Therefore, the body is not supplied with the fixed potential in the SOI transistor which may cause operation degradation due to the body effect and the body is supplied with the fixed potential in the SOI transistor which cause no operation degradation due to the body effect, to thereby suppress the parasitic bipolar effect. Thus, high-speed operation and low power consumption in the SOI transistor can be achieved.

In most cases, the transistor of which the body potential should be fixed has the source supplied with the fixed potential and the transistor of which the body should be in a floating state is connected in series between the two transistors of different conductivity types of which the body potentials should be fixed. Since no unnecessary second field is disposed in the semiconductor device of the second aspect, improvement in yield is achieved by reduction of the required area and of the wire length.

In the semiconductor device of the third aspect, the potential at the body of the PMOS transistor may not be fixed since the parasitic bipolar effect of the PMOS transistor is smaller than that of the NMOS transistor.

In the semiconductor device of the fourth aspect, the SOI transistor in the second-type field of which the body potential is not fixed has a greater current driving power than that in the first-type field of which the body potential is fixed, and therefore the second-type field may be made narrower to reduce the area required to form the transistor.

In the semiconductor device of the fifth aspect, the wire provided in the SOI transistor is placed on the LOCOS oxide film to reduce the capacitance associated with the wire, so that a logic circuit which operates at high speed with low power consumption can be achieved.

In the semiconductor device of the sixth aspect, the first subarray and the second subarray are different in length in the first direction, and therefore the cluster has a rectangular shape with a smaller rectangular shape chipped on one corner. The clusters are arranged engaging each other with their chipped portions to reduce the area required for the gate array.

Moreover, the SOI transistor of which the body should be in the floating state may be provided in the first subarray, and therefore the SOI transistor having the body to be supplied with the fixed potential and that having the body not to be supplied with the fixed potential may be mixed in the semiconductor device.

In the semiconductor device of the seventh aspect, the predetermined potential is applied outside the end portion of the gate electrode (opposite to the first portion) in the second portion, and therefore the potential at the body is fixed to suppress the body effect. Since the body and a diffusion region are isolated using a pn isolation and the second portions are arranged discretely from each other, each body can be supplied with the fixed potential or brought into the floating state independently.

In the semiconductor device of the eighth aspect, the predetermined potential is applied outside the end portion of the isolation electrode (opposite to the first portion) in the second portion, and therefore the potential at the body is fixed to suppress the body effect. Since the body and a diffusion region are isolated using a pn isolation and the second portions are arranged discretely from each other, each body can be supplied with the fixed potential or brought into the floating state independently.

In the semiconductor device of the ninth aspect, the predetermined potential is applied outside the end portion of the isolation electrode (opposite to the first portion) in the second portion, and therefore the potential at the body is fixed to suppress the body effect. Since the SOI transistors are arranged discretely from each other, each body can be supplied with the fixed potential or brought into the floating state independently.

In the semiconductor device of the tenth aspect, the gate electrode and the body are supplied with the same potential and the channel of the SOI transistor is turned on by the gate electrode with the potential at the body determined so that the channel may turn on much more quickly. Therefore, the SOI transistor which operates at high speed with low power consumption can be provided.

In the semiconductor device of the eleventh aspect, since the plug penetrates the interlayer film to connect the second portion to the gate electrode, the potential which is applied to the gate electrode can be applied also to the body in a small area and the channel of the SOI transistor is turned on by the gate electrode with the potential at the body determined so that the channel may turn on much more quickly.

Therefore, the SOI transistor which operates at high speed with low power consumption can be provided.

In the semiconductor device of the twelfth aspect, since the Shottky junction is established in an interface between the plug and the second portion and the voltage between the body and the active region is smaller than the voltage between the gate electrode and the active region, quick recombination of the carriers is achieved in the body.

In the semiconductor device of the thirteenth aspect, since the plug is electrically connected to the second portion through the end portion, the potential which is applied to the gate electrode can be applied to the body in a small area and the channel of the SOI transistor is turned on by the gate electrode with the potential at the body determined so that the channel may turn on much more quickly. Therefore, the SOI transistor which operates at high speed with low power consumption can be provided.

In the semiconductor device of the fourteenth aspect, even if the pn junction in the contact region is reversely biased, the reversely-biased pn junction carries a tunnel current to electrically connect the gate electrode to the body.

In the semiconductor device of the fifteenth aspect, since the crystallinity of the contact region is degraded, even if the pn junction in the contact region is reversely biased, the reversely-biased pn junction carries a tunnel current to electrically connect the gate electrode to the body.

In the semiconductor device of the sixteenth aspect, the pn junction established by the contact between the second portion and the end portion is forward biased, so that the gate electrode and the body can be electrically connected.

In the semiconductor device of the seventeenth aspect, selection as to whether the body is brought into the floating state or connected to the gate electrode can be made. When the body is connected to the gate electrode, the second portion and the end portion are interconnected with the wire. Only a smaller area is required to allow the selection.

In the semiconductor device of the eighteenth aspect, the predetermined potential is applied to the isolation electrode to achieve the FS isolation, so that a short circuit between the bodies of the adjacent SOI transistors can be avoided.

In the semiconductor device of the nineteenth aspect, the first SOI transistor and the second SOI transistor are connected in series to each other and the first gate electrode and the second gate electrode are connected in common thus constituting an inverter. Moreover, these are connected in common to the two second portions at one portion and therefore both of the potentials at the first body and the second body are determined equivalent to those at the first gate electrode and the second gate electrode. Thus, the channels of the SOI transistors are turned on by the gate electrodes with the potentials at the bodies determined so that the channels may turn on much more quickly. Therefore, the inverter which operates at high speed with low power consumption can be provided in a small area.

A first object of the present invention is to provide a master layout where both an SOI transistor having a body to be supplied with a fixed potential and that having a body not to be supplied with the fixed potential may be mixed. A second object of the present invention is to provide a structure including an FS gate and a gate electrode, where the SOI transistor having the body to be supplied with the fixed potential and that having the body not to be supplied with the fixed potential may be mixed. A third object of the present invention is to provide a technique of supplying the gate electrode and the body with the same potential.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a plan view showing a variation in accordance with the fourth preferred embodiment of the present invention;

FIG. 15 is a plan view showing a fifth preferred embodiment of the present invention;

DESCRIPTION OF THE PREFERRED EMBODIMENTS

A. The First Invention:

The first invention is intended to achieve the first object, with regard to the master layout.

(A-1) The First Preferred Embodiment

Figure 1:
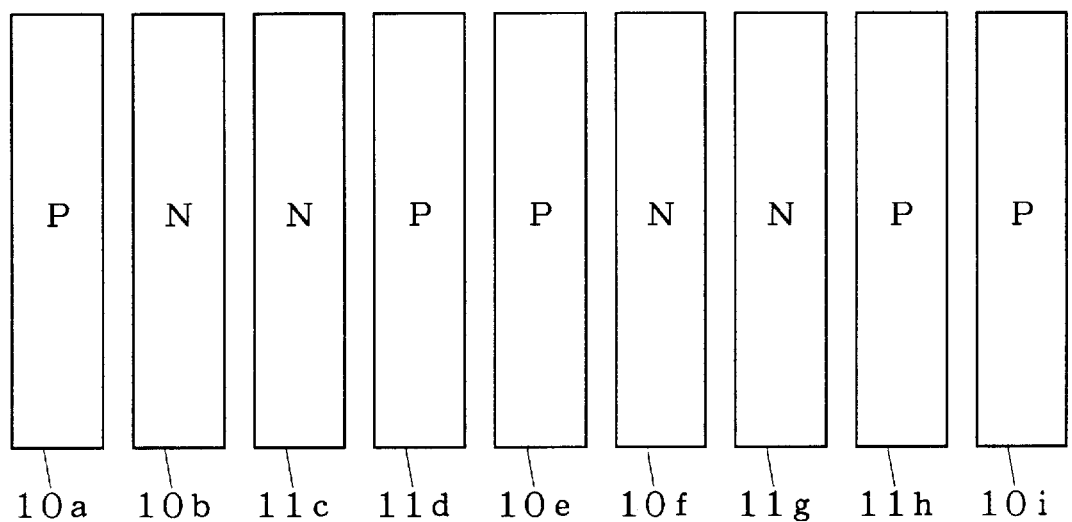
FIG. 1 is a plan view showing a first preferred embodiment of the present invention.
Figure 45:
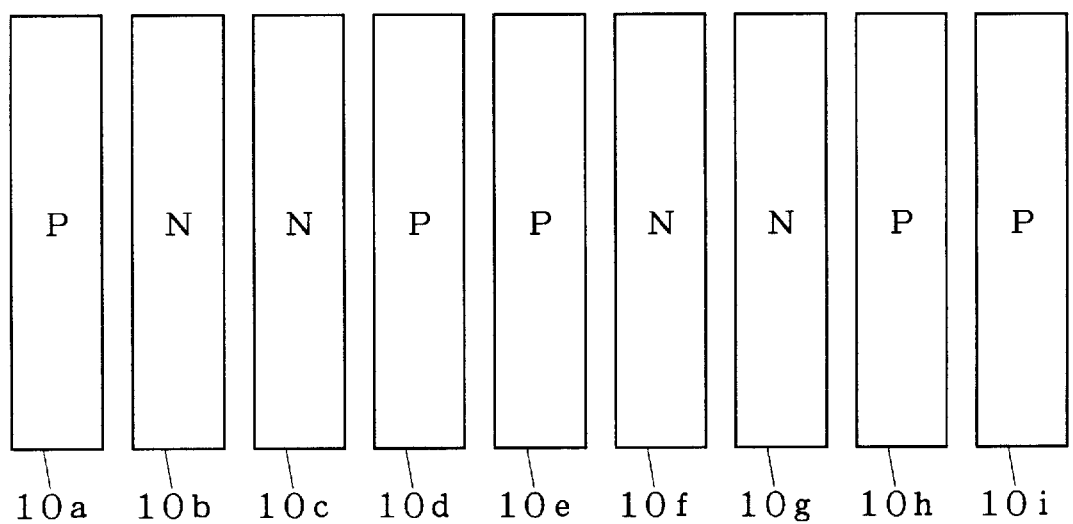
FIG. 45 is a plan view of a master layout.

FIG. 1 is a plan view showing the first preferred embodiment of the present invention. FIG. 1 shows an arrangement where the FS-isolated fields 10c, 10d, 10g and 10h in FIG. 45 are replaced by fields with LOCOS-isolated structure (referred to as "LOCOS-isolated fields" hereinafter) 11c, 11d, 11g and 11h.

Figure 2:
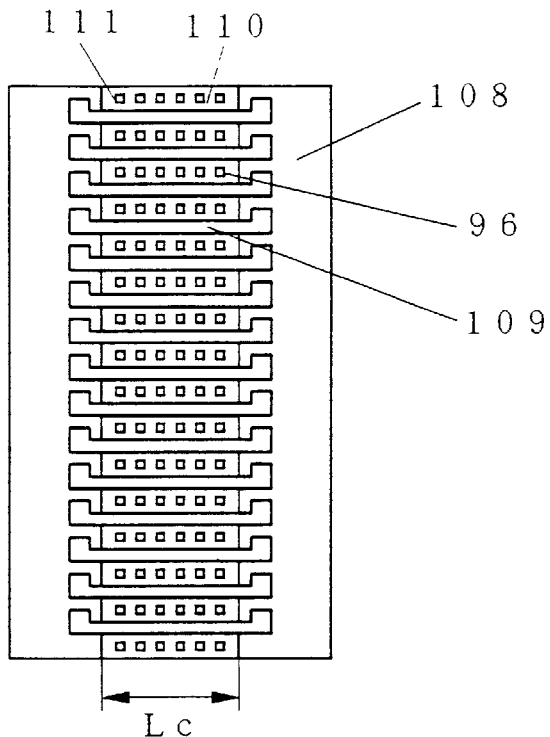
FIG. 2 is a plan view of a LOCOS isolated structure.

FIG. 2 is a plan view of a LOCOS isolated structure. An active region 111 having a width Lc is formed and provided with the source-drain contacts 96 to establish an electrical connection with wires which are not shown. For simple illustration, the gate contact 97 of the gate electrode 109 is not shown in FIG. 2. The active regions 111 are electrically isolated from each other using only LOCOS oxide films 108, not FS gate.

Figure 3:
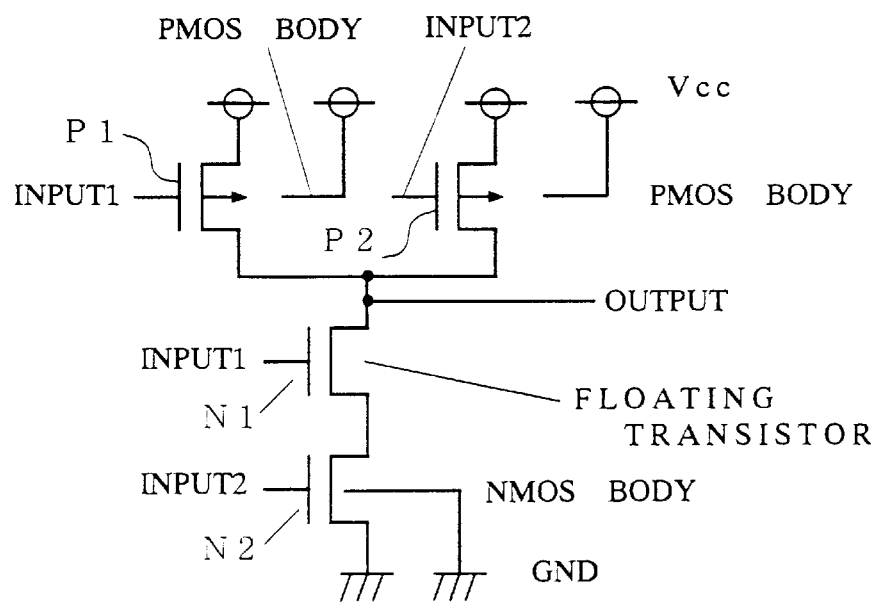
FIG. 3 is a circuit diagram showing a specific structure of a two-input NAND circuit.
Figure 44A:
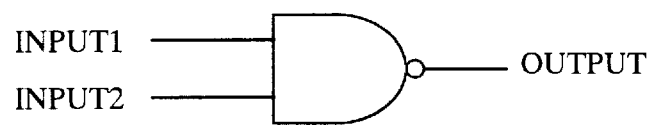
FIGS. 44A and 44B are circuit diagrams showing a NAND circuit.
Figure 44B:
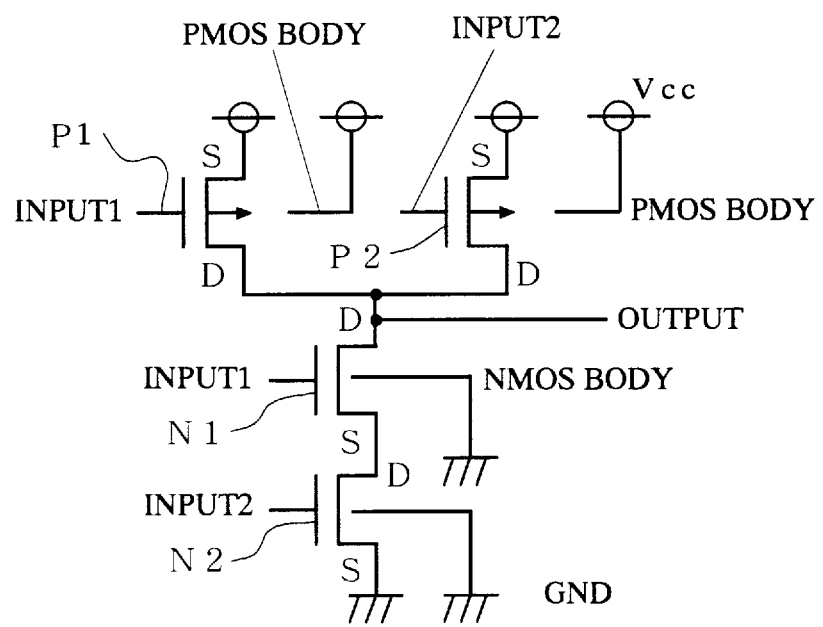

FIG. 3 is a circuit diagram showing a specific structure of a two-input NAND circuit. The NAND circuit of FIG. 3 is different from that of FIG. 44B in that the body of the NMOS transistor N1 is in a floating state.

Figure 4:
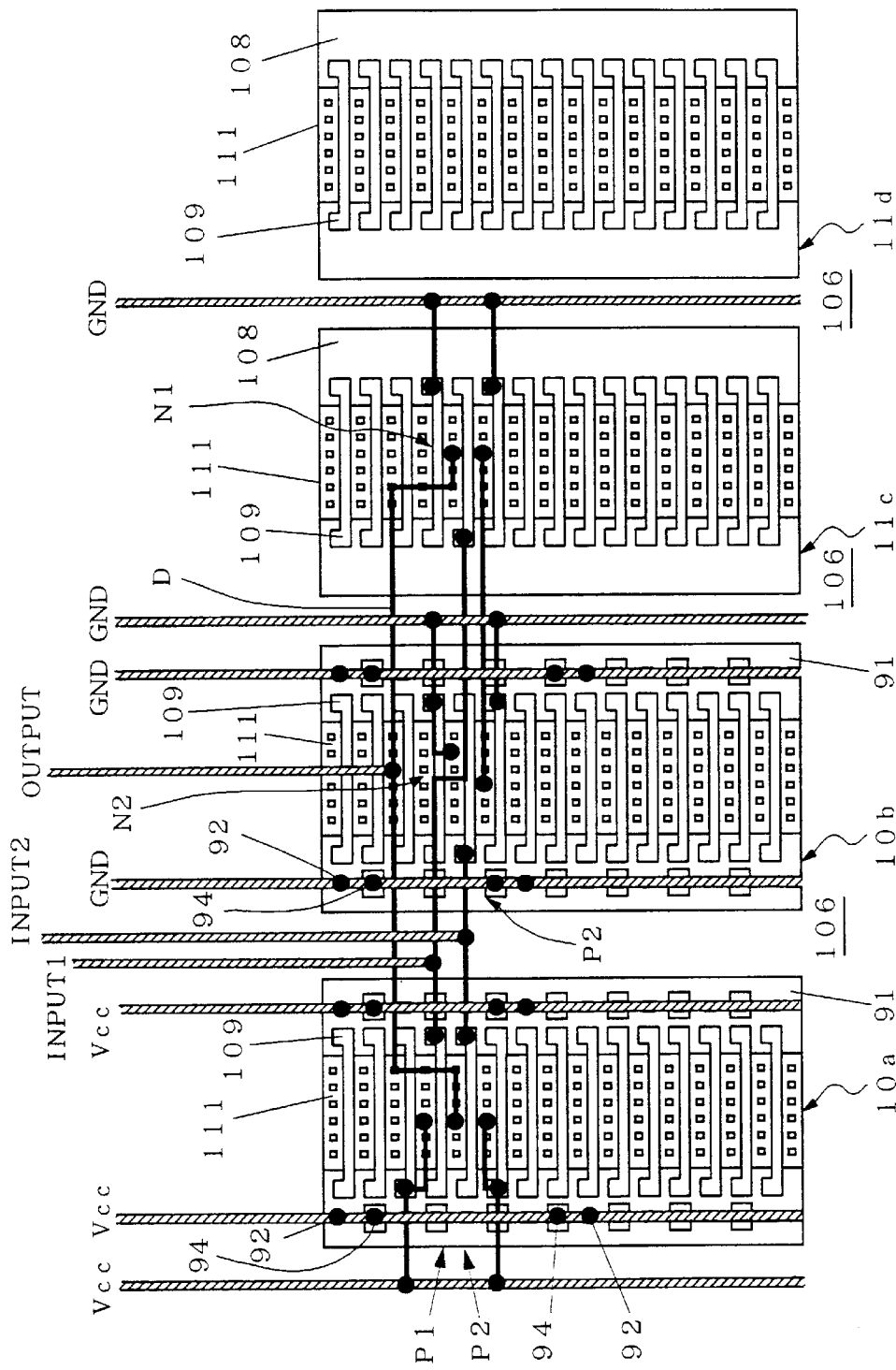
FIG. 4 is a plan view showing formation of the NAND circuit.

FIG. 4 is a plan view showing formation of the NAND circuit using the FS-isolated field and the LOCOS-isolated field. Hatched lines and heavy lines represent wires and placed in different layers. Solid circles represent not only connection between wires but also connection between wires and semiconductor layers or metal layers.

In the FS-isolated field 10a, the PMOS transistors P1 and P2 are formed and the bodies of these SOI transistors are supplied with the potential Vcc through the body contacts 94 with wires which are vertically placed. Similarly, the FS gate 91 is supplied with the potential Vcc through the FS gate contact 92 to achieve the FS isolation. Furthermore, a common active region is used as the respective drains of transistors P1 and P2 and the respective sources are gate-isolated from the other active regions.

In the FS-isolated field 10b, the NMOS transistor N2 is formed and the body of this SOI transistor is supplied with the ground potential GND through the body contact 94 with the wire which is vertically placed. Similarly, the FS gate 91 is supplied with the ground potential GND through the FS gate contact 92 to achieve the FS isolation.

The NMOS transistor N1 is formed in the LOCOS-isolated field 11c and the body thereof is in the floating state. Thus, it is possible to avoid body effect in the NMOS transistor N1.

If the FS-isolated field and the LOCOS-isolated field are appropriately mixed, the transistor having the body to be supplied with a fixed potential may be formed in the FS-isolated field and the transistor having the body not to be supplied with the fixed potential may be formed in the LOCOS-isolated field.

Figure 5A:
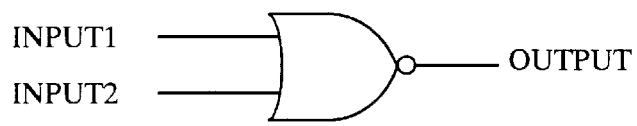
FIGS. 5A and 5B are circuit diagrams showing a configuration of a NOR circuit.
Figure 5B:
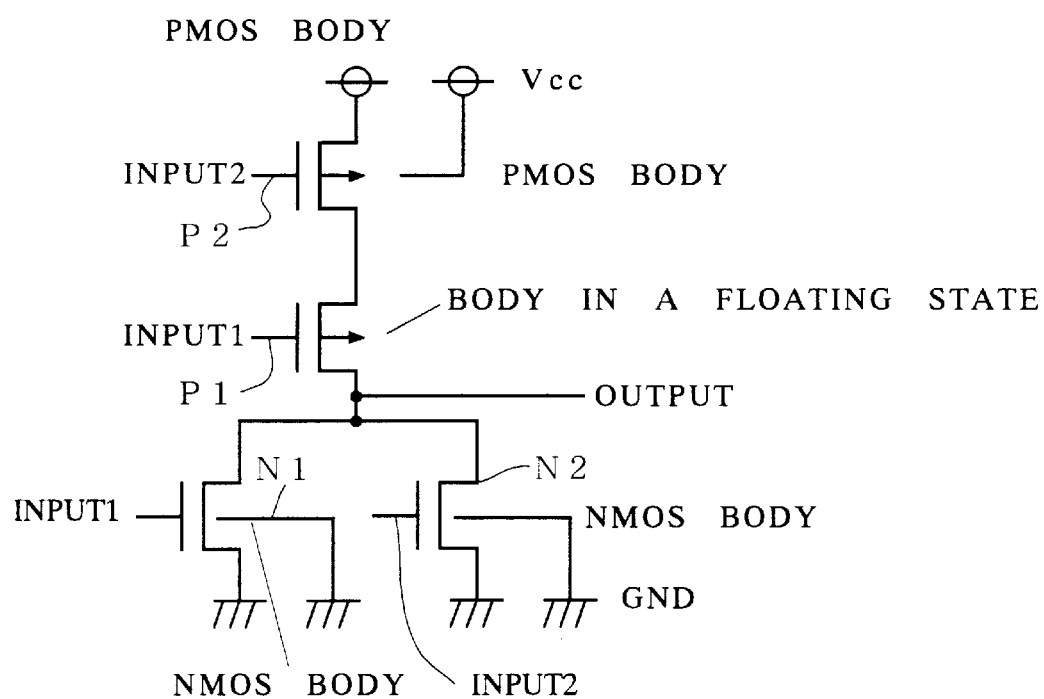

FIG. 5A shows a symbol of a NOR circuit and FIG. 5B shows a specific configuration thereof. The NOR circuit consists of NMOS transistors N1 and N2 connected in parallel and PMOS transistors P1 and P2 connected in series between the potential point supplying the potential Vcc and the ground potential GND.

Since the sources of transistors N1, N2 and P2 are supplied with the ground potential GND, GND and the potential Vcc respectively, if the bodies of the transistors N1, N2 and P2 are supplied with the ground potential GND, GND and the potential Vcc respectively, no body effect is produced on the transistors. However, when the potential VDD is applied to the body of the transistor P1 having the source which is not supplied with the fixed potential, the body effect is produced. To avoid this, the body of the transistor P1 is desired to be kept in the floating state.

Figure 6:
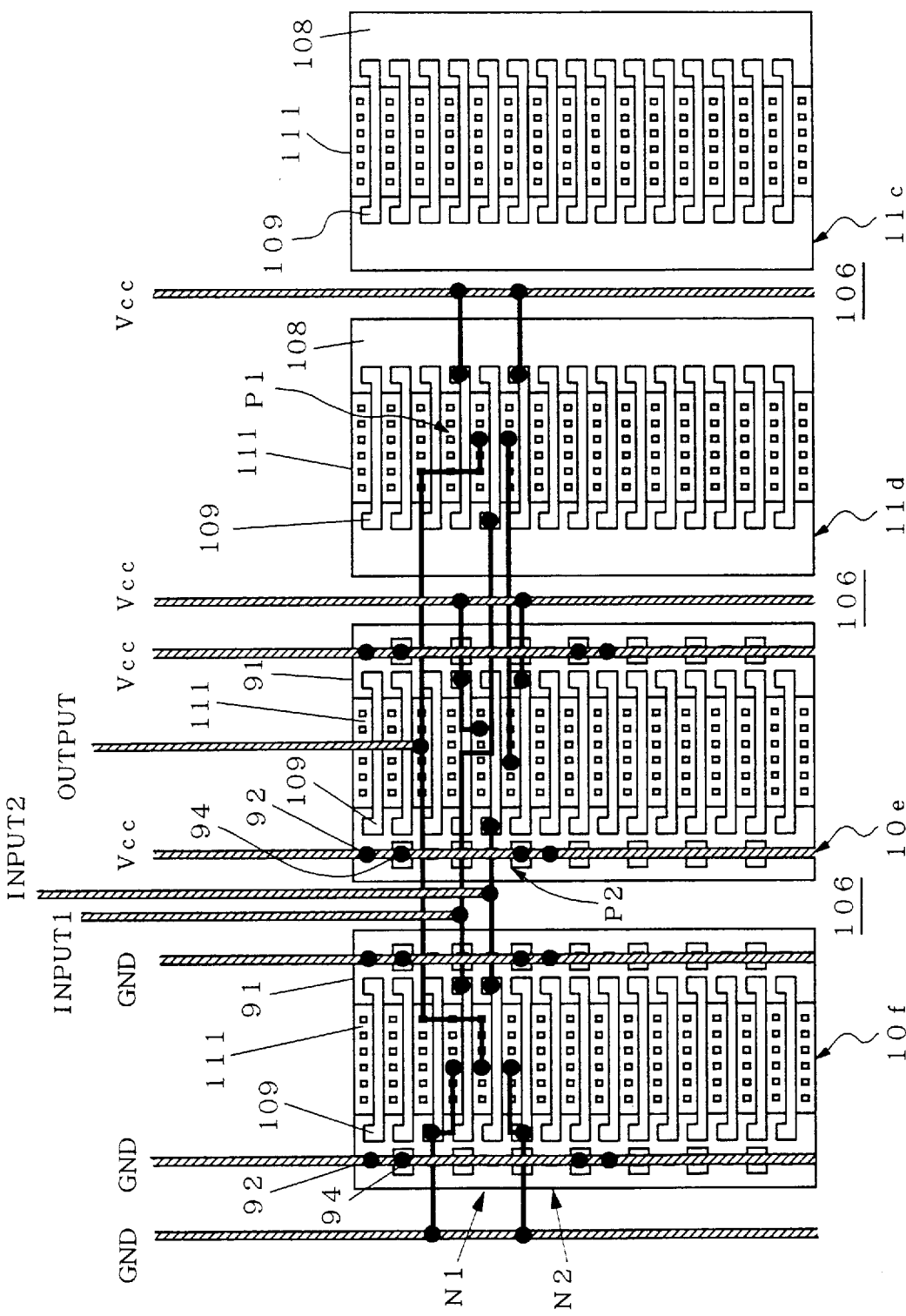
FIG. 6 is a plan view showing formation of the NOR circuit.

FIG. 6 is a plan view showing formation of the NOR circuit using the FS-isolate field and the LOCOS-isolated field. FIG. 6 shows the master layout of FIG. 1 upside down.

In the FS-isolated field 10f, the NMOS transistors N1 and N2 are formed and the bodies of these SOI transistors are supplied with the ground potential GND through the body contacts 94 with the wires which are vertically placed. Similarly, the FS gate 91 is supplied with the ground potential GND through the FS gate contact 92 to achieve the FS isolation. Furthermore, a common active region is used as the respective drains of transistors N1 and N2 and the respective sources are gate-isolated from the other active regions.

In the FS-isolated field 10e, the PMOS transistor P2 is formed and the body of this SOI transistor is supplied with the potential Vcc through the body contact 94 with the wire which is vertically placed. Similarly, the FS gate 91 is supplied with the potential Vcc through the FS gate contact 92 to achieve the FS isolation.

The PMOS transistor P1 is formed in the LOCOS-isolated field 11d and the body thereof is in the floating state. Therefore, it is possible to avoid the body effect in the PMOS transistor P1.

Thus, the body of the transistor which may cause operation degradation due to the body effect is not supplied with the fixed potential and that of the transistor which causes no operation degradation due to the body effect is supplied with the fixed potential, to thereby suppress the parasitic bipolar effect. In summary, the transistor having the body to be supplied with the fixed potential and that having the body not to be supplied with the fixed potential are mixed, and therefore, low power consumption and high-speed operation can be achieved.

Furthermore, instead of the LOCOS-isolated field, a field isolated using other isolation technique, for example, a mesa isolation may be used.

Figure 7:
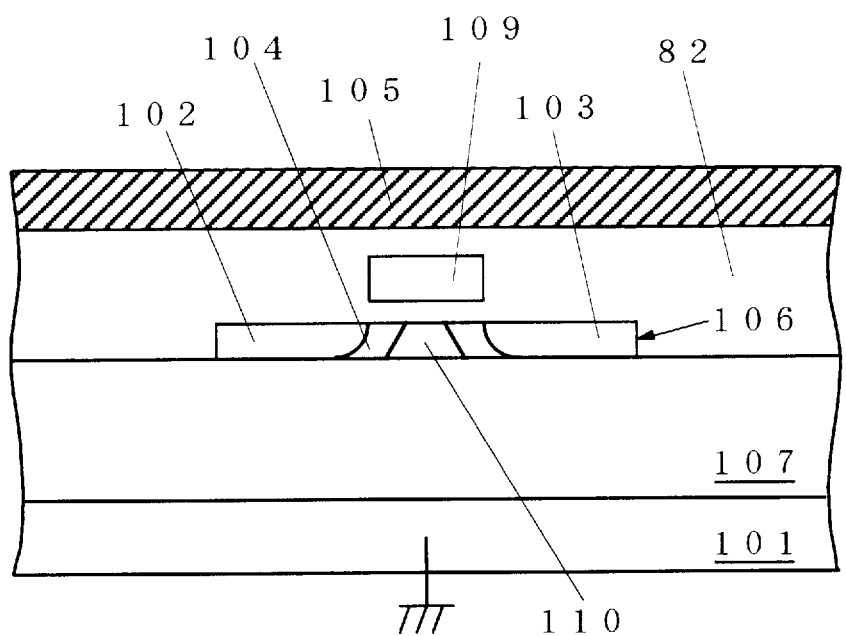
FIGS. 7 and 8 are cross sections showing a mesa isolation.
Figure 8:
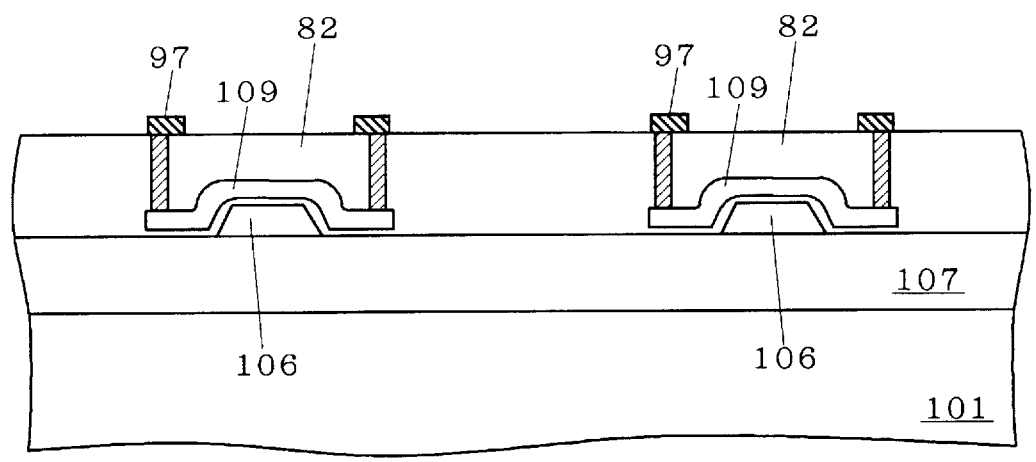

FIGS. 7 and 8 are cross sections showing the mesa isolation. FIG. 7 is a cross section in a vertical direction (direction of field extension) and FIG. 8 is a cross section in a horizontal direction (direction of field arrangement). In the mesa-isolated structure, the SOI layer 106 is removed by etching. When the transistor is formed in a mesa-isolated field, the body thereof is brought into the floating state.

(A-2) The Second Preferred Embodiment

Figure 9:
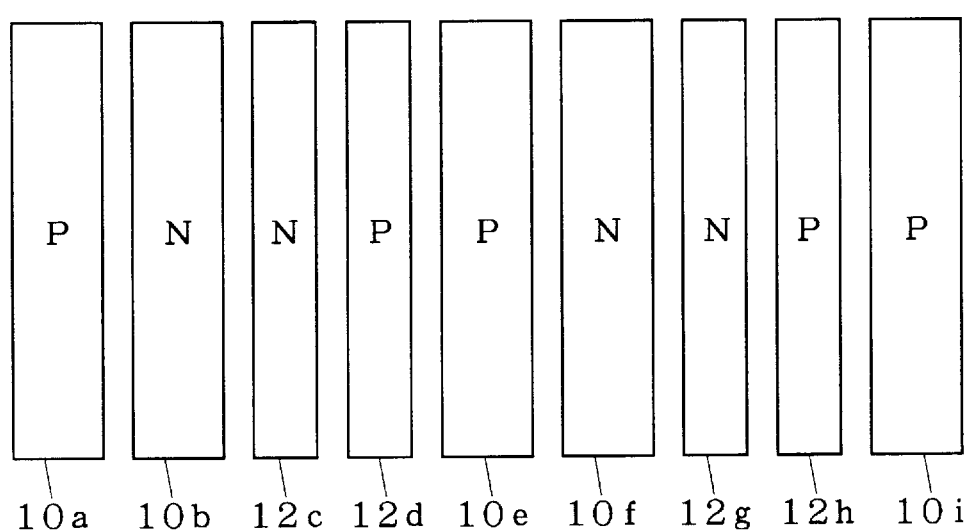
FIG. 9 is a plan view showing a second preferred embodiment of the present invention.

FIG. 9 is a plan view showing the second preferred embodiment of the present invention. FIG. 9 shows an arrangement where the LOCOS-isolated fields 11c, 11d, 11g and 11h in FIG. 1 are replaced by LOCOS-isolated fields 12c, 12d, 12g and 12h. The LOCOS-isolated fields 12c, 12d, 12g and 12h are narrower than the FS-isolated fields 10a, 10b, 10e, 10f and 10i.

The SOI transistor provided in the LOCOS-isolated field and having the body not to be supplied with the fixed potential has a larger current driving power due to the parasitic bipolar effect than that provided in the FS-isolated filed and having the body to be supplied with the fixed potential. Therefore, the width of the LOCOS-isolated field on which the gate width of the SOI transistor depends becomes narrower and the area required to form the transistor is reduced.

Naturally, instead of the LOCOS-isolated field, a field isolated using other isolation technique, for example, a mesa isolation may be used.

(A-3) The Third Preferred Embodiment

Figure 10:
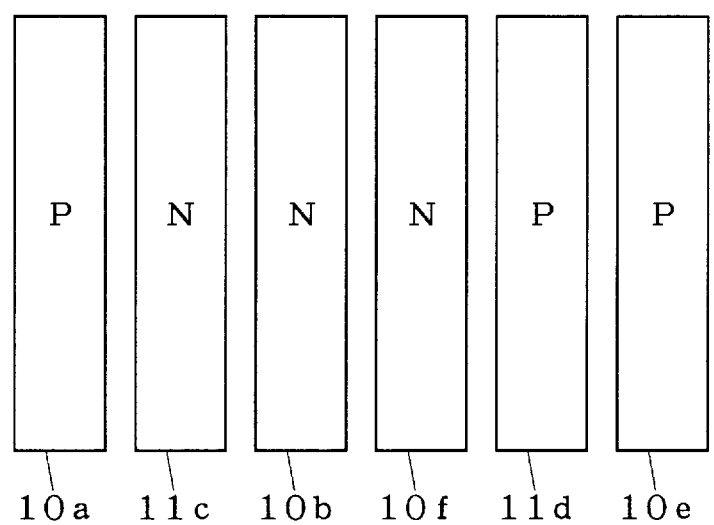
FIG. 10 is a plan view showing a third preferred embodiment of the present invention.

FIG. 10 is a plan view showing the third preferred embodiment of the present invention. FIG. 10 shows an arrangement where the p-type FS-isolated field 10a, n-type LOCOS-isolated field 11c, n-type FS-isolated field 10b, n-type FS-isolated field 10f, p-type LOCOS-isolated field 11d and the p-type FS-isolated field 10e are arranged in sequence from left to right.

In the master layout of FIG. 1, the two FS-isolated fields including p-type and n-type fields and the two LOCOS-isolated fields including p-type and n-type fields are alternately arranged and the four fields constitute a set of fields. On the other hand, as can be seen from the structure of FIG. 4, the NAND circuit consists of a trio of fields including the p-type FS-isolated field, n-type FS-isolated field and n-type LOCOS-isolated field. Accordingly, the p-type LOCOS-isolated field 11d is left unused. There may be a case where unnecessary fields are arranged when a lot of NAND circuits which needs only three fields are formed. Similarly, the n-type LOCOS isolated field 11c is unnecessary, as shown in FIG. 6, when the NOR circuit is formed.

In the master layout of FIG. 10, two FS-isolated fields and one LOCOS-isolated field located therebetween are arranged and these adjacent three fields constitute a set of fields, so that no unuseful field is arranged.

Figure 11:
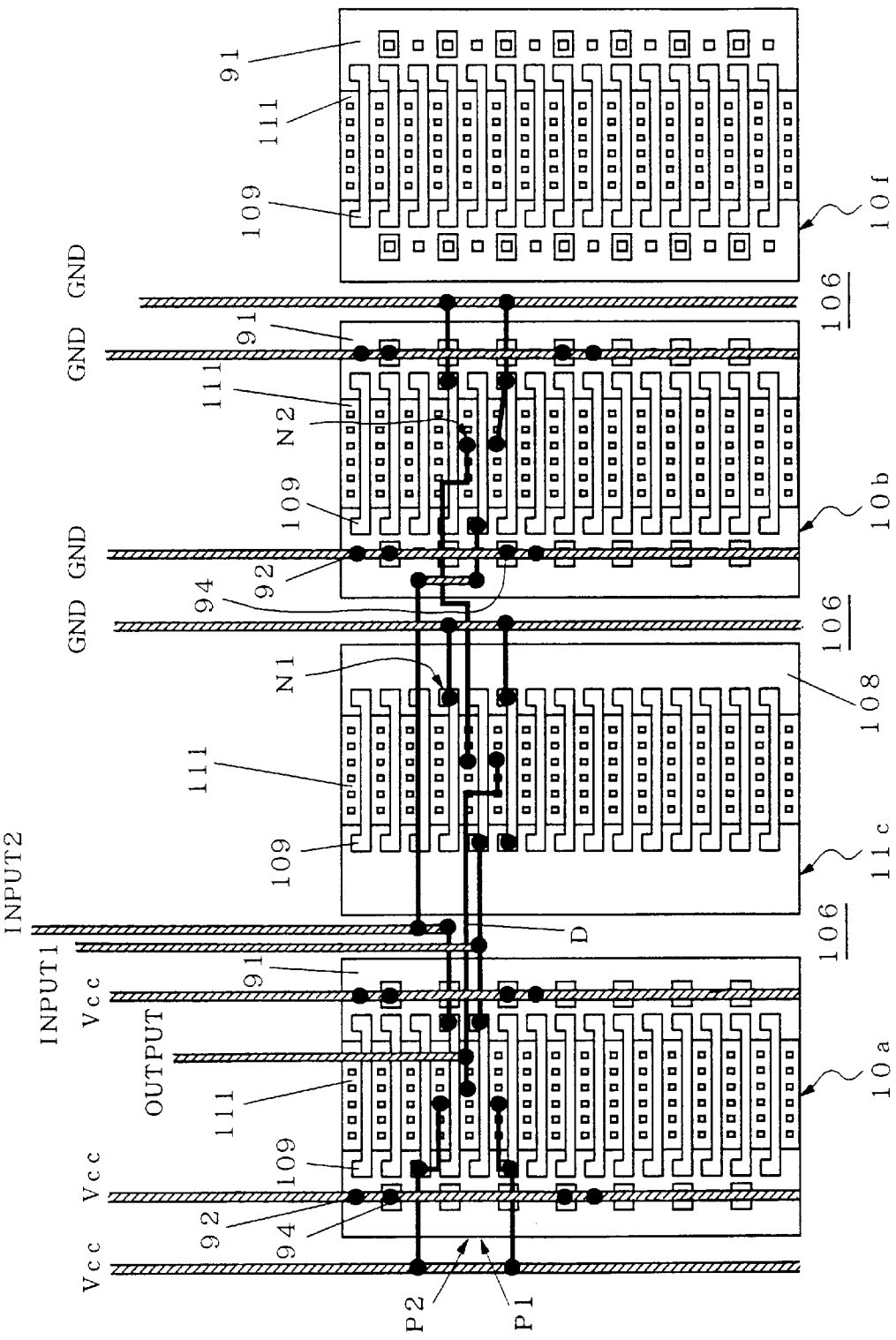
FIG. 11 is a plan view showing formation of a NAND circuit.

FIG. 11 is a plan view showing formation of the NAND circuit in the master layout of FIG. 10. Formation of the NAND circuits as shown in FIG. 11 has no unnecessary field and allows reduction in area, and moreover needs shorter wire for connecting the NMOS transistor N1 and the PMOS transistors P1 and P2 (referring to a wire D connected to an output wire OUTPUT) than that of FIG. 4. Therefore, improvement in yield of wires is achieved.

The master layout of FIG. 10 is useful to not only formation of NAND circuit but also formation of NOR circuit. In most cases, generally, the SOI transistor with the body to be fixed has the source supplied with fixed potential such as the potential Vcc or the ground potential GND, and the SOI transistor with the body to be brought into the floating state is connected in series between the two SOI transistors of different conductivity types having the bodies of which potential is to be fixed. Therefore, the master layout of FIG. 10 produces an effect of improvement in yield by reduction in the occupied area and in wire length even when used in a general logic circuit.

Figure 12:
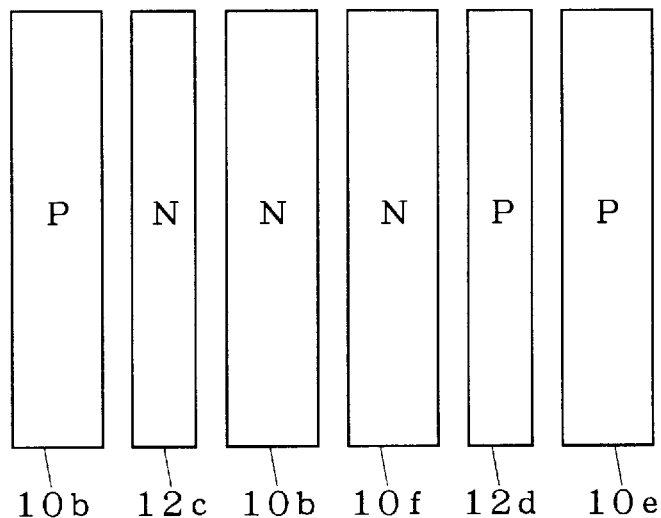
FIG. 12 is a plan view showing a variation in accordance with the third preferred embodiment of the present invention.

It is natural in the third preferred embodiment that the LOCOS-isolated field may be made narrower as shown in FIG. 12, like the second preferred embodiment.

(A-4) The Fourth Preferred Embodiment

Figure 13:
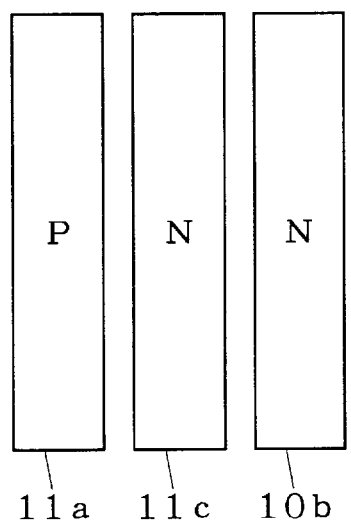
FIG. 13 is a plan view showing a fourth preferred embodiment of the present invention.

FIG. 13 is a plan view showing the fourth preferred embodiment of the present invention. FIG. 13 shows a layout where the p-type LOCOS-isolated field 11a, n-type LOCOS-isolated field 11c and n-type FS-isolated field 10b are arranged in sequence from left to right.

A master layout having such arrangement as shown in FIG. 13 may be used, where two kinds of n-type fields, i.e., LOCOS-isolated field and FS-isolated field and one kind of p-type field, i.e., LOCOS-isolated field are included.

As to carrier movement, holes move in a channel of the PMOS transistor and electrons move in a channel of the NMOS transistor. The hole has a larger effective mass and is less likely to be impact-ionized than the electron. Accordingly, the PMOS transistor in general produces less parasitic bipolar effect than the NMOS transistor.

Therefore, as discussed in this preferred embodiment, the master layout where the fields in which the PMOS transistors are formed, i.e., p-type fields, are all LOCOS-isolated fields and n-type fields include the LOCOS-isolated fields and the FS-isolated fields makes it possible to suppress the parasitic bipolar effect in a logic circuit on the whole consisting of the NMOS transistors and the PMOS transistors provided therein.

Naturally, as shown in FIG. 14, the LOCOS-isolated fields may be made narrower in the fourth preferred embodiment, like the second preferred embodiment.

(A-5) The Fifth Preferred Embodiment

FIG. 15 is a plan view showing the fifth preferred embodiment of the present invention. FIG. 15 shows a layout where the p-type FS-isolated field 10a, n-type LOCOS-isolated field 11c, n-type FS-isolated field 10b and the p-type LOCOS-isolated field 11d are arranged in sequence from left to right.

This arrangement where the FS-isolated field and the LOCOS-isolated field of the same conductivity type are adjacently disposed and the FS-isolated field and the LOCOS-isolated field are alternately disposed allows placement of signal lines on the LOCOS oxide film.

Figure 16:
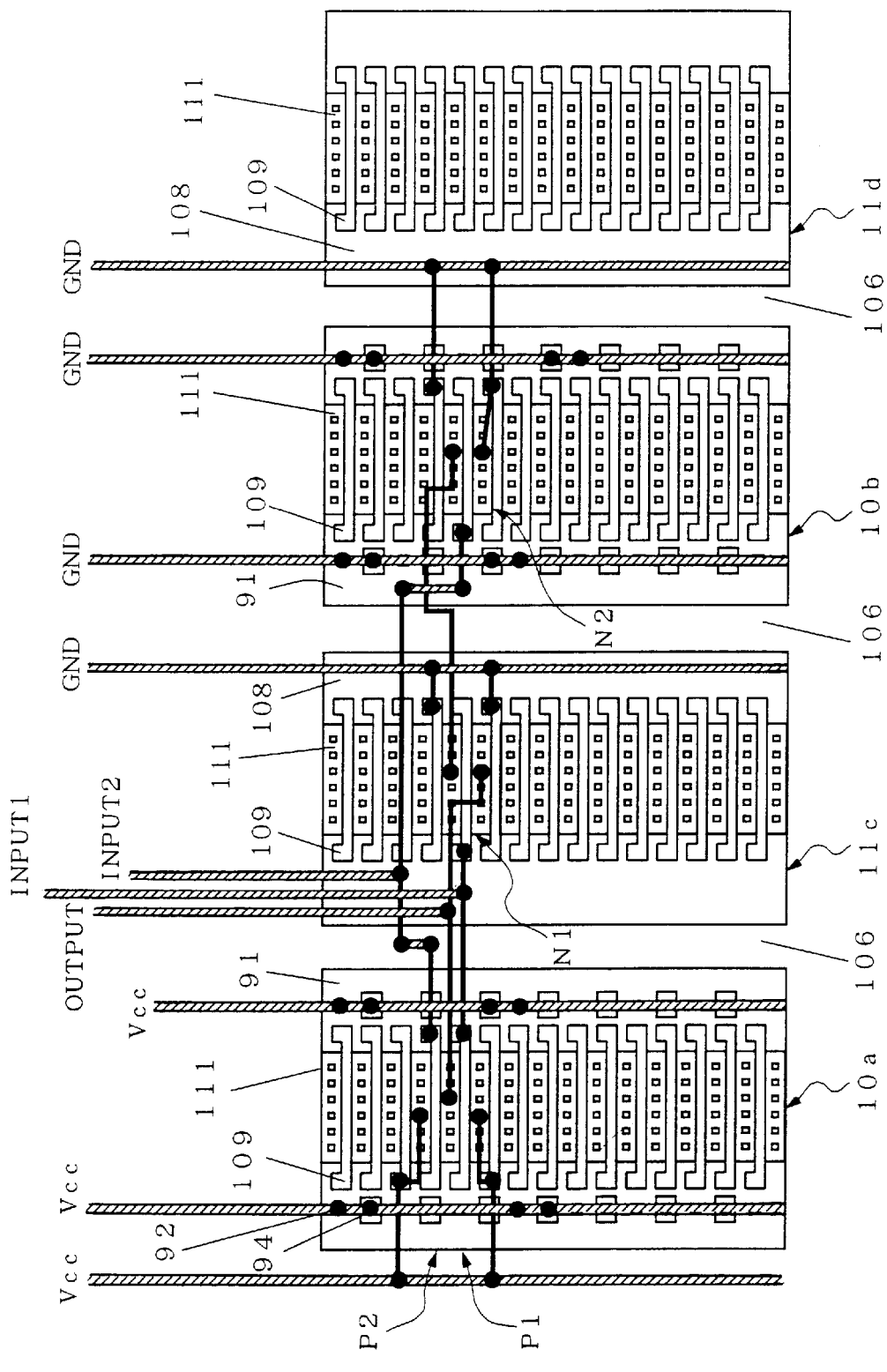
FIG. 16 is a plan view showing formation of a NAND circuit.

FIG. 16 is a plan view showing formation of the NAND circuit in the master layout of FIG. 15. The interconnection with wires of FIG. 16 is different from that for the NAND circuit of FIG. 11 in that input wires INPUT1 and INPUT2 and the output wire OUTPUT are placed on the LOCOS oxide film 108 of the LOCOS-isolated field 11c and further in that a ground wire GND is also placed on the LOCOS oxide film 108 of the LOCOS-isolated fields 11c and 11d.

Since the above placement of wires is achieved, the capacitance associated with wires is reduced and therefore a logic circuit which operates at high speed with low power consumption in the fifth preferred embodiment.

(A-6) The Sixth Preferred Embodiment

As to regions required to form one NAND circuit, the active region and the gate electrode are periodically provided on each field.

In the p-type FS-isolated field, two adjacent transistors, i.e., the PMOS transistors P1 and P2, are needed. These transistors are gate-isolated from outside at two portions. For each gate isolation, a region of half a transistor is needed. Therefore, a region of three cycles of transistors in a vertical direction is needed to form the NAND circuit in the p-type FS-isolated field.

In the n-type FS-isolated field, the NMOS transistor N2 is provided and gate-isolated from outside at two portions. Therefore, a region of two cycles of transistors in the vertical direction is needed to form the NAND circuit in the n-type FS-isolated field. Similarly, a region of two cycles of transistors in the vertical direction is needed to form the NAND circuit in the n-type LOCOS-isolated field.

On the other hand, no transistor having the body to be in the floating state is provided to form an inverter as discussed in the background art, and a pair of transistors are formed in the FS-isolated field. In other words, a region of two cycles of transistors in the vertical direction is needed in both the p-type and n-type FS-isolated fields.

Thus, if a logic circuit to be constructed includes the inverters and the NAND circuits in the proportions of 1 to 1, a master layout including the first submaster layout constituted of the FS-isolated fields and the LOCOS-isolated fields and the second submaster layout constituted of only the FS-isolated fields in the proportions of three to two in the vertical direction ensures an effective use of the area.

Figure 17:
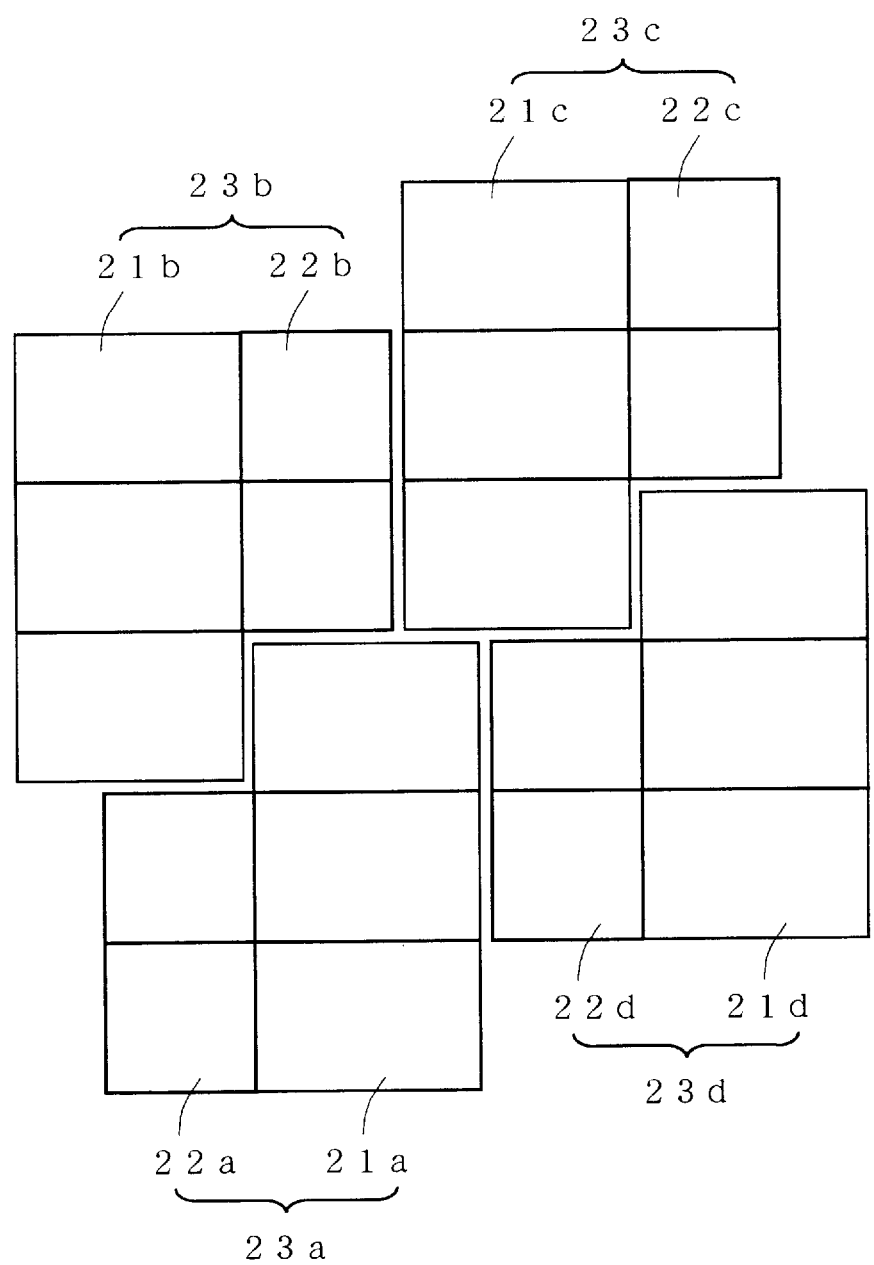
FIG. 17 is a plan view showing a sixth preferred embodiment of the present invention.

FIG. 17 is a plan view showing the sixth preferred embodiment of the present invention. A master layout of FIG. 17 has an arrangement of clusters 23a, 23b, 23c, 23d, . . . For example, the cluster 23a includes the first submaster layout 21a and the second submaster layout 22a in the proportions of three to two in the vertical direction. The first submaster layout 21a and the second submaster layout 22a may be divided into subclusters in accordance with the ratio in the vertical direction.

The cluster 23a has a rectangular shape with a smaller rectangular shape chipped on one corner. The other clusters 23b, 23c, 23d . . . each have the same shape as the cluster 23a. Engagement of the chipped rectangles of these clusters allows reduction in area required for the master layout.

The ratio of the first submaster layout 21a and the second submaster layout 22a in the vertical direction is not limited to three to two as discussed in this preferred embodiment, but depends on the number of SOI transistors having the bodies to be brought into the floating state in the logic circuit to be constructed.

B. The Second Invention:

The second invention is intended to achieve the second and third objects, with regard to the construction of the FS gate and the gate electrode.

(B-1) The Seventh Preferred Embodiment

Figure 18:
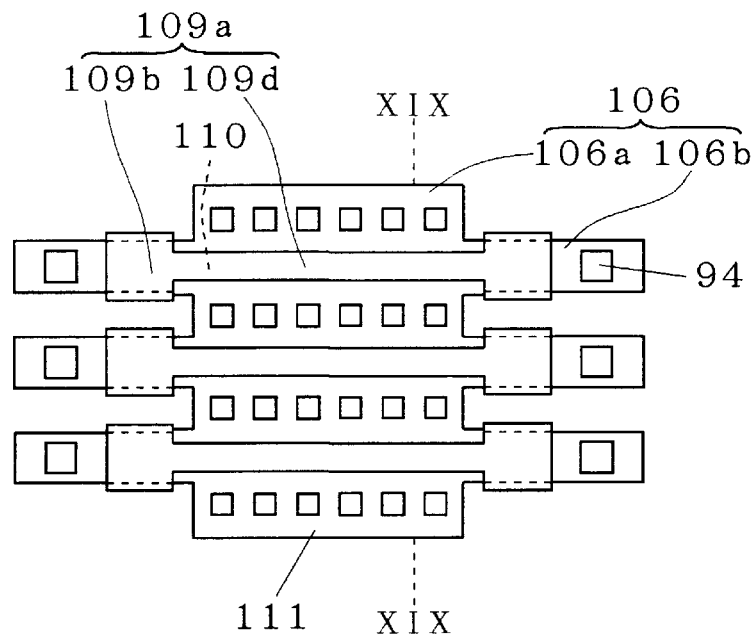
FIG. 18 is a plan view showing a seventh preferred embodiment of the present invention.
Figure 19:
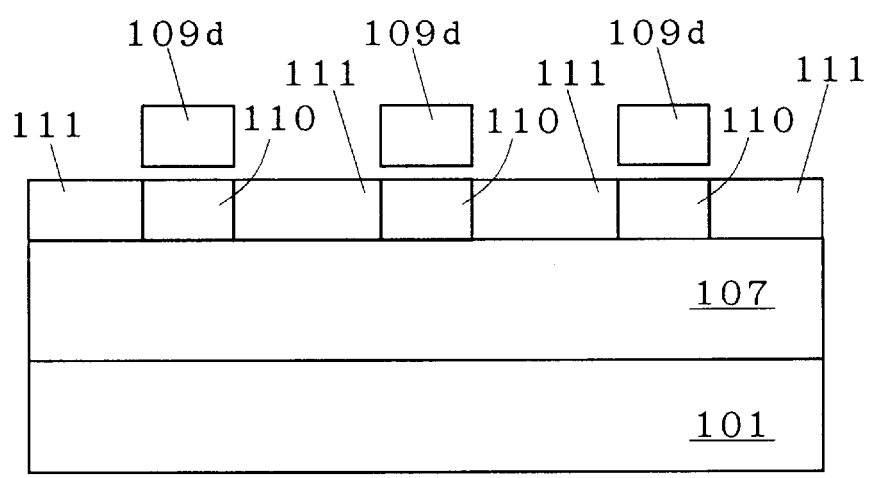
FIG. 19 is a cross section showing the seventh preferred embodiment of the present invention.

FIG. 18 is a plan view showing an SOI transistor in accordance with the seventh preferred embodiment of the present invention, and FIG. 19 is a cross section of FIG. 18 taken along the line XIX—XIX. The SOI layer 106 includes the first portion 106a extending in the vertical direction in which the active region 111 is formed and a plurality of second portions 106b extending from the first portion 106a in the horizontal direction discretely from each other as shown in FIG. 18.

A gate electrode 109a is provided above the SOI layer 106 and an end portion 109b of the gate electrode 109a covers part of the second portion 106b in the vertical direction. The end portion 109b is provided with the gate contact 97 (not shown in FIG. 18 for simple illustration). In the second portion 106b, the body contact 94 is provided opposite to the first portion 106a with respect to the gate electrode 109a.

Since the active region 111 is generally formed by impurity injection in a self-alignment manner using the gate electrode 109a, no additional impurity, besides original impurity, is injected (no impurity is injected afterwards) into the SOI layer 106 immediately below the gate electrode 109a. For example, the first portion 106a immediately below a main portion 109d (covering part of the first portion 106a in the horizontal direction) of the gate electrode 109a except the end portion 109b serves as the body 110. Similarly, no additional impurity is injected into the second portion 106b immediately below the end portion 109b, which is contiguous with the body 110.

When a predetermined potential is applied to the body contact 94 provided in the second portion 106b, the potential is applied to the body 110. Furthermore, since there is a pn junction between the body 110 and the active region 111, the two bodies 110 disposed adjacently in the vertical direction are electrically isolated. For example, when the NMOS transistor is formed as shown in FIG. 18, the SOI layer 106 is determined to have p-type conductivity, and the conductivities of the body 110 and the active region 111 are p-type and n-type, respectively. Since the body 110 is supplied with the ground potential GND in the NMOS transistor, the pn junction between the body 110 and the active region 111 is reversely biased and electrically isolated (such isolation is referred to as "pn isolation" hereinafter).

Figure 39:
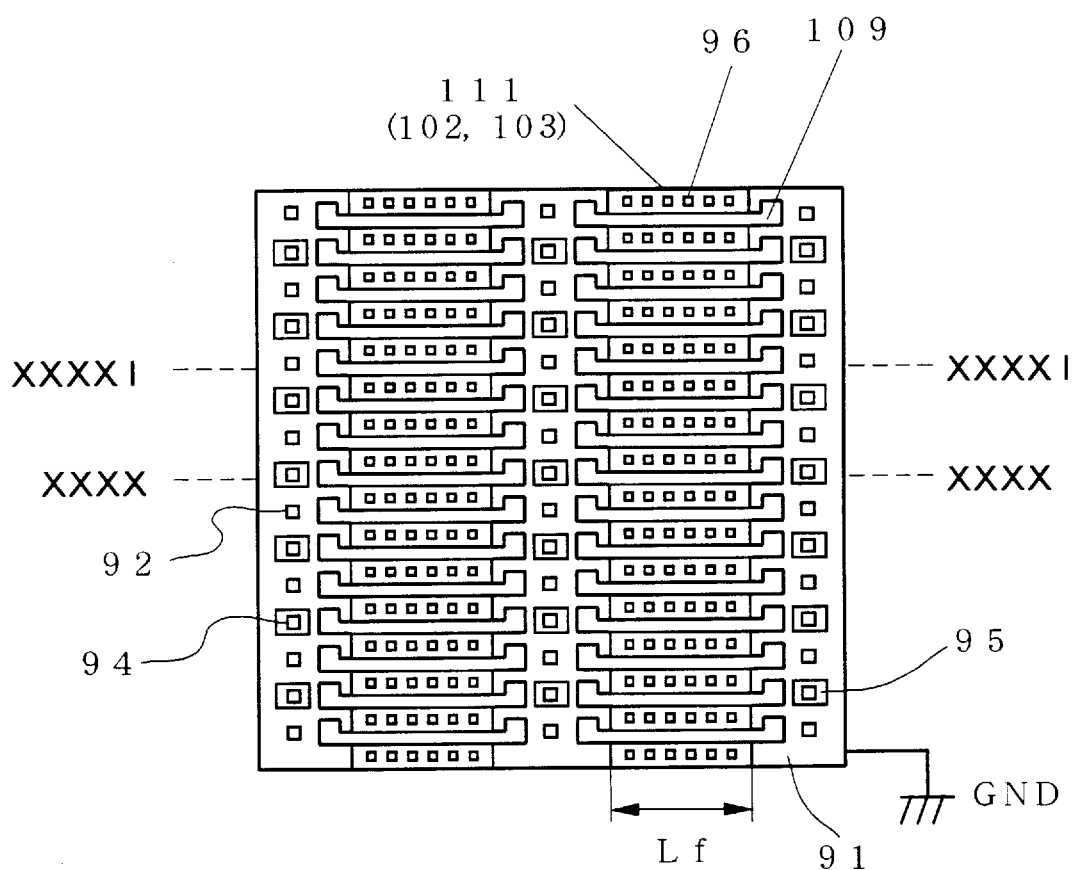
FIG. 39 is a plan view of an FS-isolated structure.

Since the second portions 106b are not contiguous in the vertical direction unlike the structure of FIG. 39, there is no case where the potential applied to one of the body contacts 94 is supplied for a plurality of bodies 110. In other words, the respective bodies 110 of the transistors are independently supplied with predetermined potentials which may be different. Therefore, it is possible to mix the transistor having the body to be supplied with the fixed potential and the transistor having the body not to be supplied with fixed potential without combination of the FS isolation and the LOCOS isolation as discussed in the first invention.

Furthermore, the impurity of the same conductivity type as that of the active region 111 may be additionally injected into the second portion 106b where the body contact 94 is provided. That is because the pn junction between this portion and the second portion 106b immediately below the end portion 109b is forward biased, and the potential applied to the body contact 94 is transmitted to the body 110.

(B-2) The Eighth Preferred Embodiment

Figure 20:
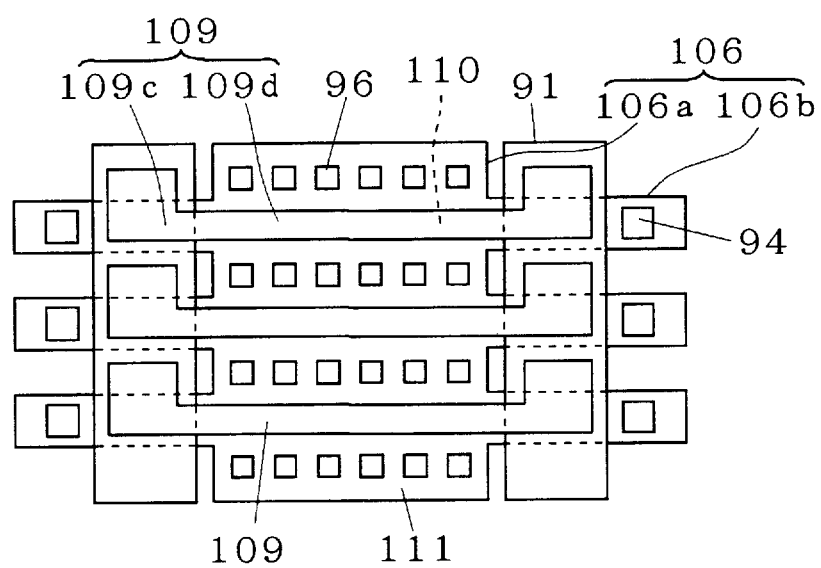
FIG. 20 is a plan view showing an eighth preferred embodiment of the present invention.

FIG. 20 is a plan view showing an SOI transistor in accordance with the eighth preferred embodiment of the present invention. Like the seventh preferred embodiment, the SOI layer 106 includes the first portion 106a extending in the vertical direction in which the active region 111 is formed and a plurality of second portions 106b extending from the first portion 106a in the horizontal direction discretely from each other. A gate electrode 109 is provided above the SOI layer 106, and an end portion 109c does not cover the second portion 106b unlike the seventh preferred embodiment. The end portion 109c is provided with the gate contact, which is not shown in FIG. 20 for simple illustration.

The FS gate 91 is disposed perpendicularly to the paper between the gate electrode 109 and the SOI layer 106, being insulated therefrom. The FS gate 91 covers part of the second portions 106b in the vertical direction. In the second portion 106b, the body contact 94 is provided opposite to the first portion 106a with respect to the FS gate 91.

Figure 40:
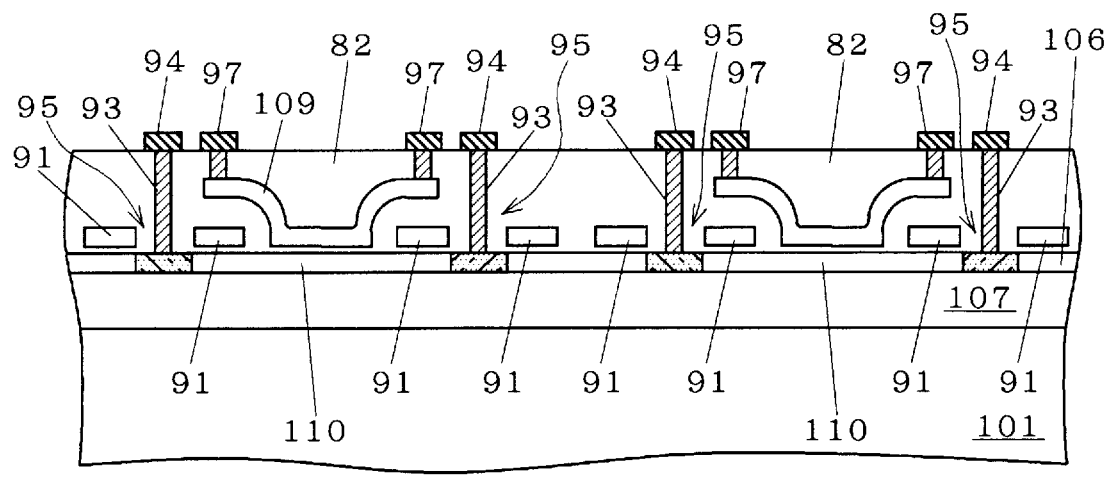
FIGS. 40 and 41 are cross sections of the FS-isolated structure.
Figure 41:
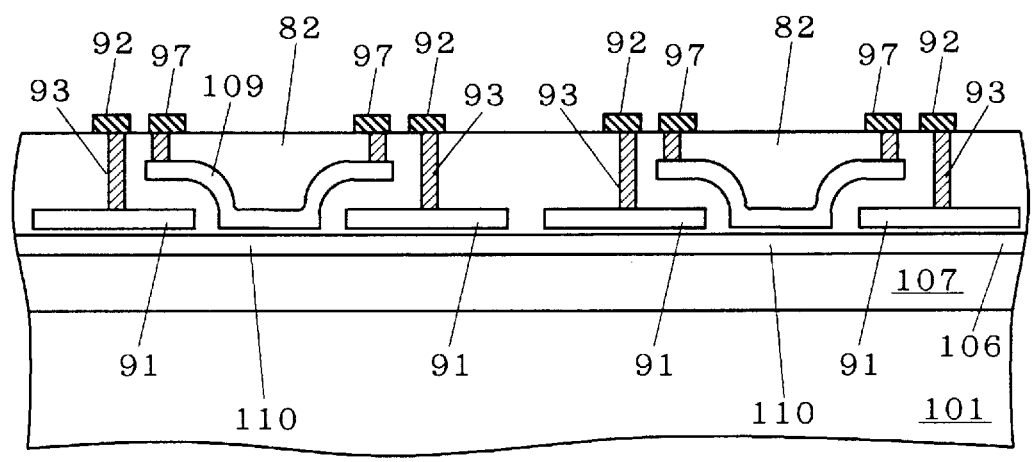
Figure 42:
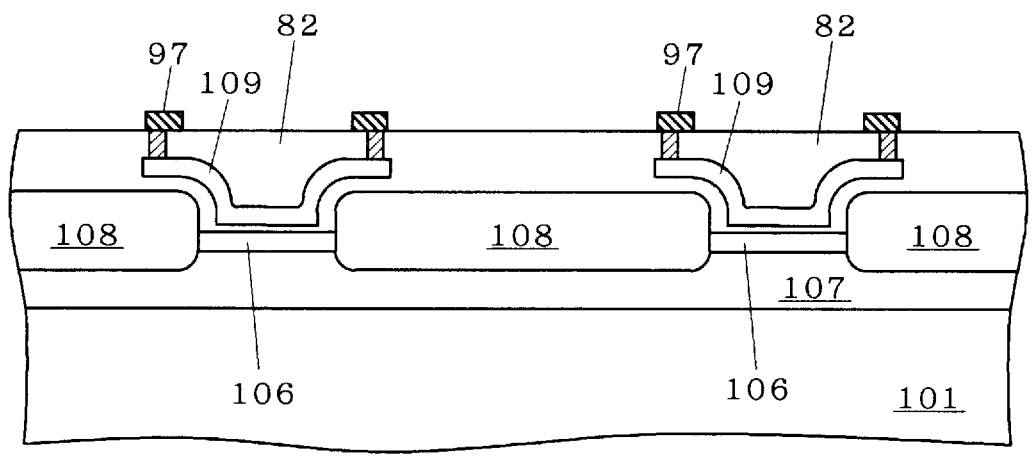
FIG. 42 is a cross section of a LOCOS-isolated structure.
Figure 43A:
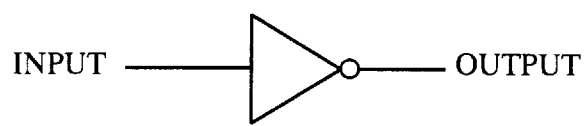
FIGS. 43A and 43B are circuit diagrams showing an inverter.
Figure 43B:
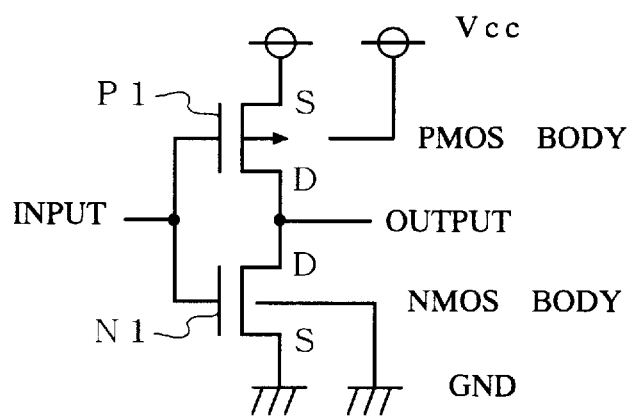

The FS gate 91 is provided above the SOI layer 106 (this side of the paper) as shown in FIGS. 40 and 41 and the gate electrode 109 is provided further above that. Since the additional impurity injection to form the active region 111 is performed thereafter, no additional impurity is injected into the SOI layer 106 immediately below the FS gate 91. Thus, the end portion 109c needs not cover the second portion 106b.

With the above construction, like the seventh preferred embodiment, it is possible to fix the potential at the body 110 by applying the predetermined potential to the body contact 94 and to electrically isolate the two bodies 110 which are adjacently disposed in the vertical direction.

The FS isolation using the FS gate 91 naturally achieves a device isolation, and moreover provision of the FS gate 91 reduces the gate capacitance produced by the gate electrode 109, thus ensuring much higher-speed operation of the transistor.

Figure 21:
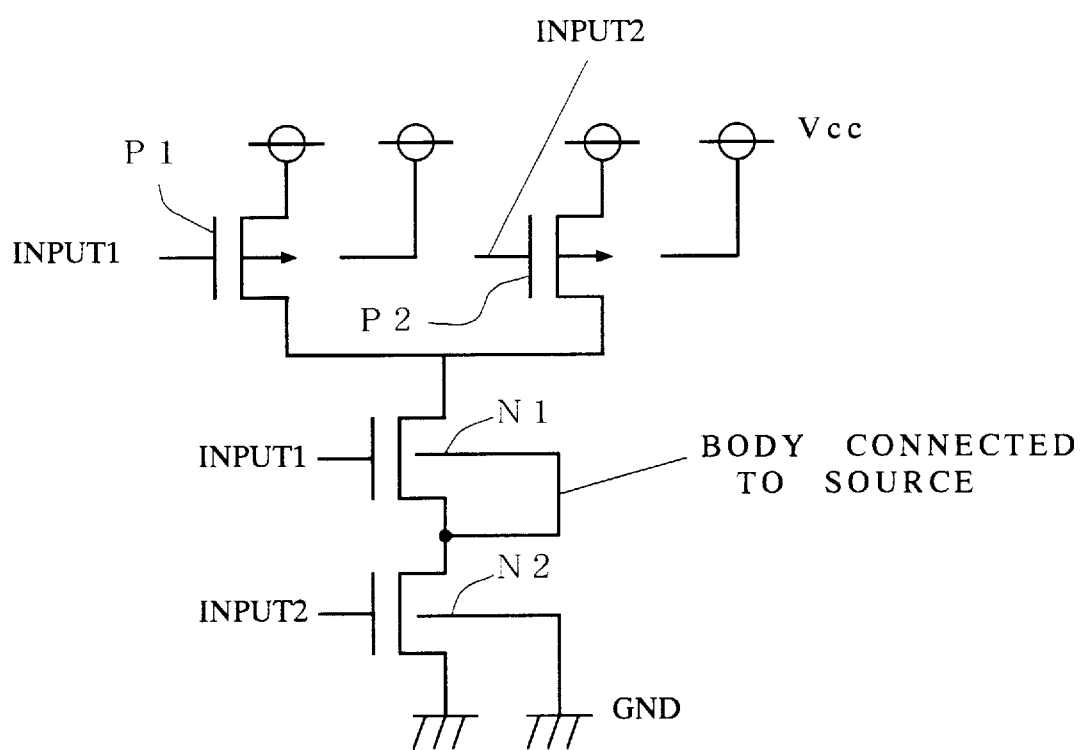
FIG. 21 is a circuit diagram showing a configuration of a NAND circuit.

FIG. 21 is a circuit diagram showing a configuration of the NAND circuit. Applying the seventh and eighth preferred embodiments to the NAND circuit, the body of the NMOS transistor can be connected to the source thereof, even in case of an SOI transistor. Therefore, neither the body effect nor the parasitic bipolar effect is produced on any of the transistors P1, P2, N1 and N2.

(B-3) The Ninth Preferred Embodiment

Figure 22:
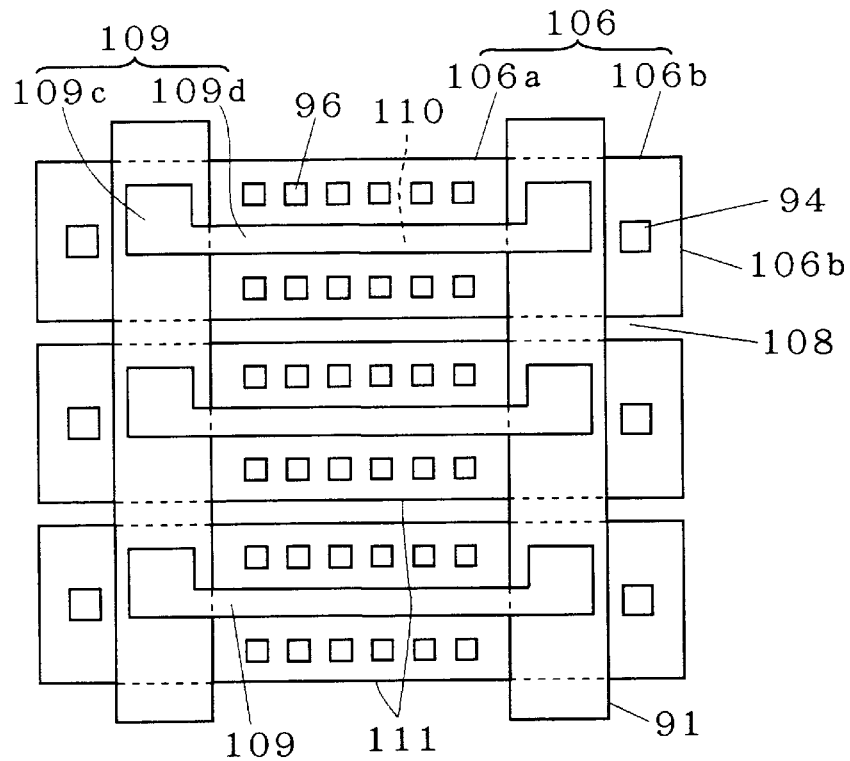
FIG. 22 is a plan view showing a ninth preferred embodiment of the present invention.

FIG. 22 is a plan view showing an SOI transistor in accordance with the ninth preferred embodiment of the present invention. The SOI layer 106 includes the first portion 106a in which the active region 111 is formed and the second portion 106b provided with the body contact 94. Unlike the seventh and eighth preferred embodiments, the first portion 106a is also vertically isolated. For example, the isolation is achieved using the LOCOS oxide film 108. From another point of view, the SOI layer 106 includes the first portion 106a and the second portion 106b which are contiguous in the horizontal direction and a plurality of SOI layers 106 are arranged discretely in the vertical direction.

The gate electrode 109 is provided above the SOI layer 106 and the end portion 109c of the gate electrode 109 does not cover the second portion 106b, like the eighth preferred embodiment. The gate contact is provided on the end portion 109c, which is not shown in FIG. 22 for simple illustration. Perpendicularly to this paper, the FS gate 91 is provided between the gate electrode 109 and the SOI layer 106, being insulated therefrom.

This isolation of the SOI layer 106 in the vertical direction using, e.g., the LOCOS oxide film 108 produces the same effect as the seventh and eighth preferred embodiments.

C. The Third Invention:

The third invention is intended to achieve the third object, with regard to a construction for supplying the gate electrode and the body with almost the same potential. By supplying the body and the gate electrode with almost the same potential, the channel potential of the transistor rises, when the transistor turns on. Therefore, the threshold voltage of the transistor becomes low and the drain current becomes high.

(C-1) The Tenth Preferred Embodiment

Figure 23:
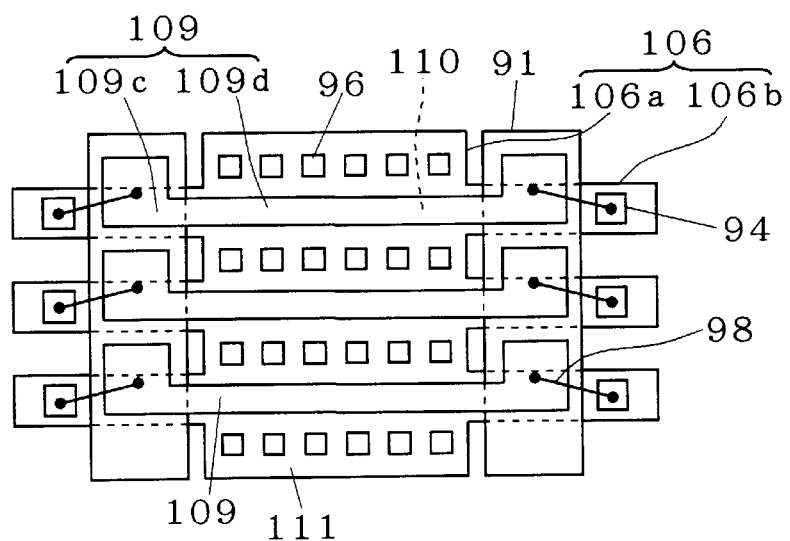
FIG. 23 is a plan view showing a tenth preferred embodiment of the present invention.

FIG. 23 is a plan view showing an SOI transistor in accordance with the tenth preferred embodiment of the present invention. The structure of FIG. 23 is characterized in that a gate-body connection line 98 for connecting the end portion 109c of the gate electrode 109 and the body contact 94 is provided additionally to the structure of FIG. 20 discussed in the eighth preferred embodiment The gate-body connection line 98 can be formed of, e.g., an aluminum wire.

With this structure, the gate electrode 109 and the body 110 are supplied with the same potential, and therefore the channel of the SOI transistor is turned on by the gate electrode 109 with the potential at the body 110 determined so that the channel can turn on more quickly. Thus, it becomes possible to provide the SOI transistor which can operate at high speed with low voltage and low power consumption.

It is natural that the gate-body connection line 98 may be used in the structure of FIGS. 18 and 22 discussed in the seventh and eighth preferred embodiments.

(C-2) The Eleventh Preferred Embodiment

Figure 24:
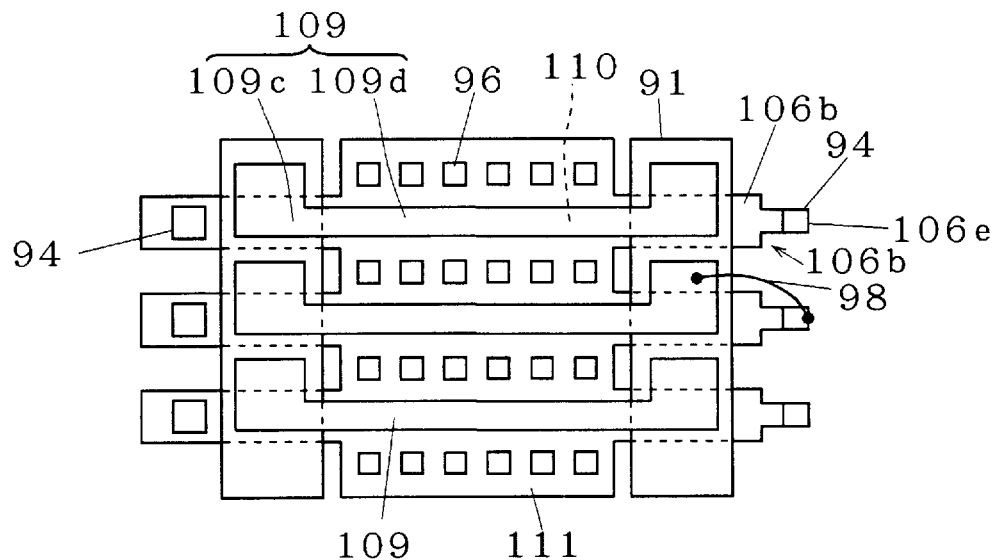
FIG. 24 is a plan view showing an eleventh preferred embodiment of the present invention.

FIG. 24 is a plan view showing an SOI transistor in accordance with the eleventh preferred embodiment of the present invention. The structure of FIG. 24 is characterized in that a third portion 106e which is narrow at a tip portion of the second portion 106b (opposite to the first portion) is provided additionally to the structure of FIG. 20 discussed in the eighth preferred embodiment and the body contact 94 is provided in the third portion 106e.

Since this structure allows reduction of capacitance in the body 110, connecting the body contact 94 and the end portion 109c of the gate electrode 109 with the gate-body connection line 98 ensures higher-speed operation of the SOI transistor (only one gate-body connection line 98 is shown in FIG. 24 for simplicity, but a plurality of gate-body connection lines 98 may be placed in the same manner as the tenth preferred embodiment).

Figure 25:
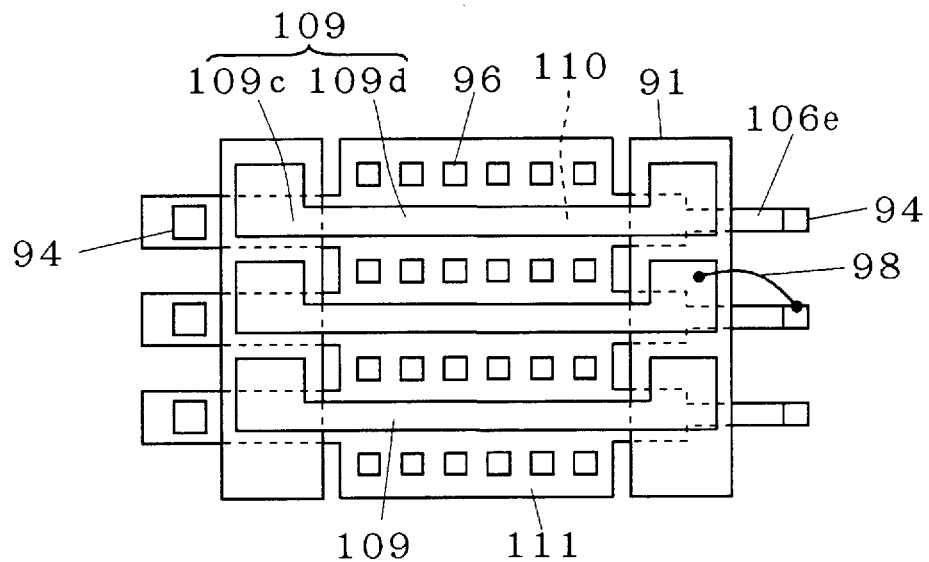
FIG. 25 is a plan view showing a variation in accordance with the eleventh preferred embodiment of the present invention.

FIG. 25 is a plan view showing another SOI transistor in accordance with the eleventh preferred embodiment of the present invention. The structure of FIG. 25 is characterized in that the third portion 106e which is narrow extends from a portion below the FS gate 91 in the structure of FIG. 20 discussed in the eighth preferred embodiment. With this structure, the above effect becomes greater.

(C-3) The Twelfth Preferred Embodiment

Figure 26:
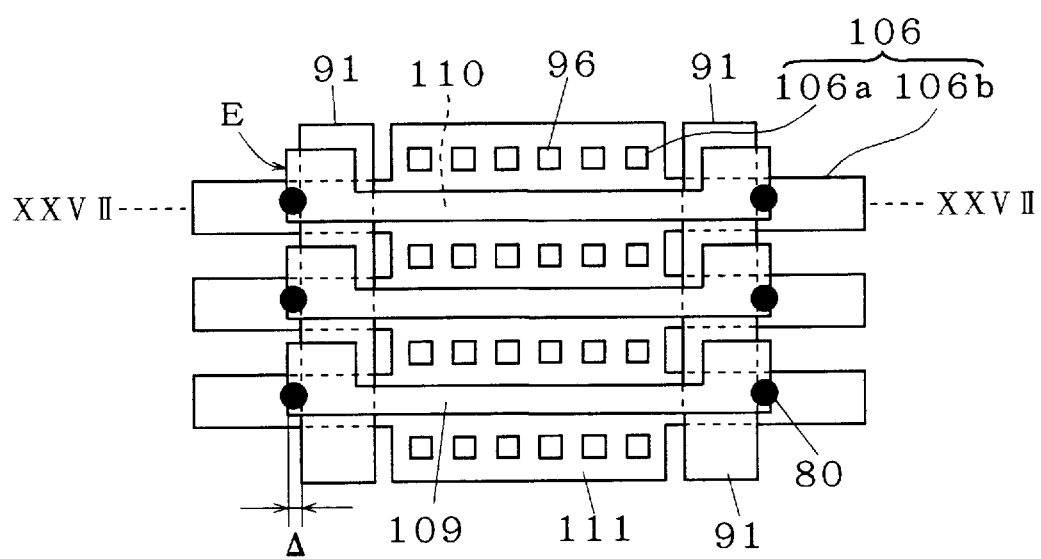
FIG. 26 is a plan view showing a twelfth preferred embodiment of the present invention.
Figure 27:
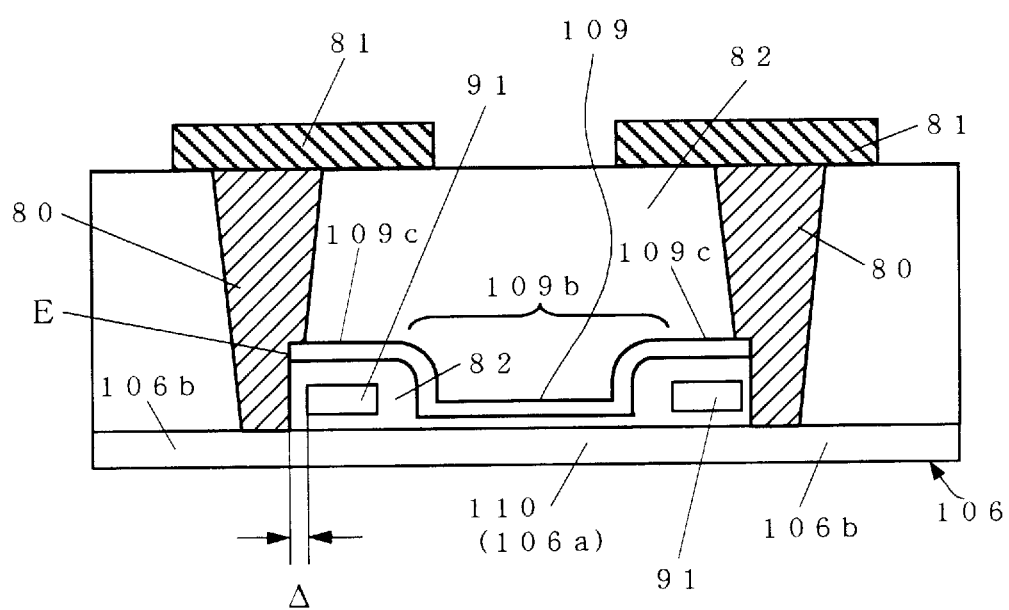
FIG. 27 is a cross section showing the twelfth preferred embodiment of the present invention.

FIG. 26 is a plan view showing an SOI transistor in accordance with the twelfth preferred embodiment of the present invention. FIG. 27 is a cross section of FIG. 26 taken along the line XXVII—XXVII. In FIG. 27, layers below the SOI layer 106 (the buried oxide film 107 and the SI substrate 101) are omitted. The structure of FIG. 26 is characterized in that a shared contact plug 80 is provided, instead of the body contact 94, in the structure of FIG. 20 discussed in the eighth preferred embodiment. The shared contact plug 80 can be formed of, e.g., tungsten.

The shared contact plug 80 is provided at an edge E of the end portion 109c of the gate electrode 109. The FS gate 91 and the gate electrode 109 cover the SOI layer 106 partially while being insulated from one another with an interlayer film 82. The shared contact plug 80 penetrates the interlayer film 82 and is connected to both the gate electrode 109 and the SOI layer 106 out of contact with the FS gate 91. To keep the shared contact plug 80 out of contact with the FS gate 91, a distance Δ is ensured between the edge E of the end portion 109c and the FS gate 91, and the FS gate 91 is recessed from the shared contact plug 80. Thus, the FS gate 91 is supplied with the predetermined potential independently of the gate electrode 109, to achieve the FS isolation.

An aluminum wire 81 which is placed on the interlayer film 82 and connected to the shared contact plug 80 is provided as shown in FIG. 27 (not shown in FIG. 26 for simplicity) and can be supplied with the predetermined potential.

With this structure, the body 110 and the gate electrode 109 can be easily short-circuited in a small area and higher-speed operation of the SOI transistor is achieved.

Although FIGS. 26 and 27 illustrate the structure where the shared contact plugs 80 are provided on both end portions 109c of one gate electrode 109, the shared contact plug 80 may be provided on either end portion 109c to produce the same effect.

Naturally, the adjacent transistors are pn-isolated as discussed in the seventh preferred embodiment since no additional impurity is injected into the second portion 106b covered with the FS gate 91.

(C-4) The Thirteenth Preferred Embodiment

Figure 28:
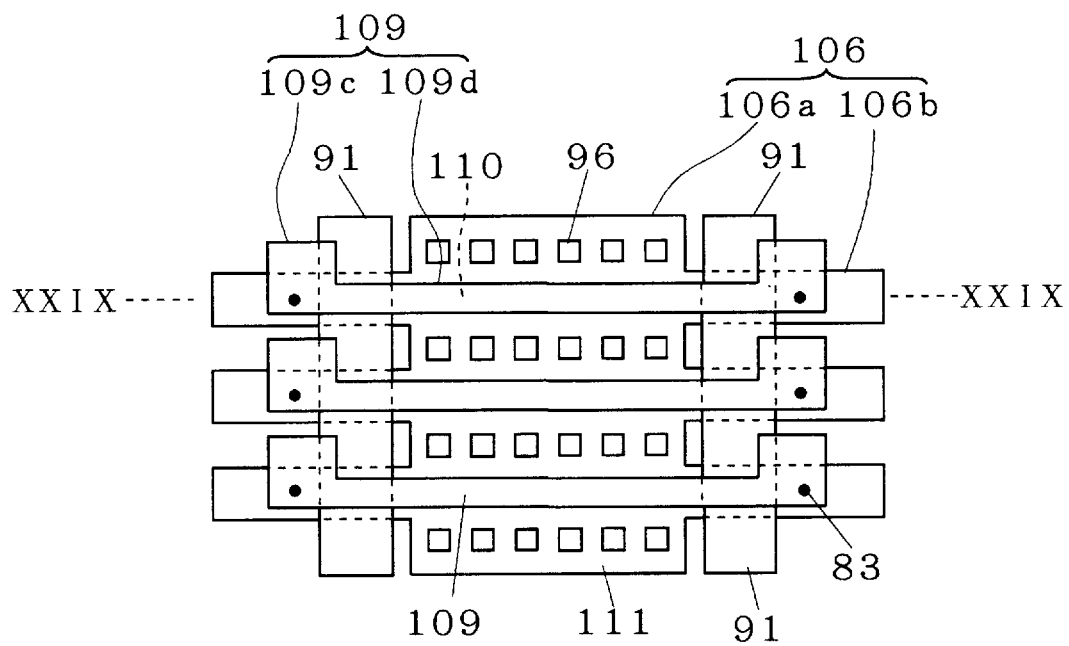
FIG. 28 is a plan view showing a thirteenth preferred embodiment of the present invention.
Figure 29:
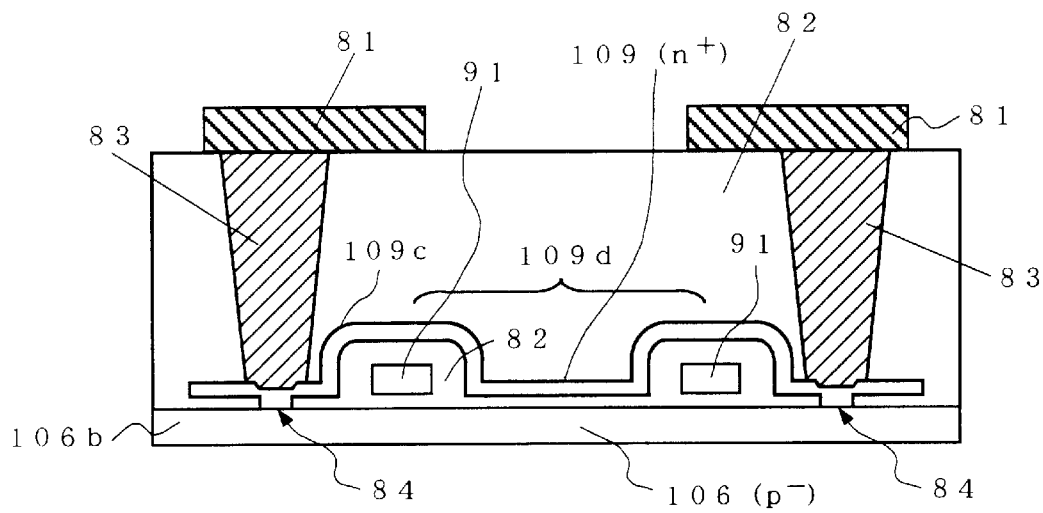
FIG. 29 is a cross section showing the thirteenth preferred embodiment of the present invention.

FIG. 28 is a plan view showing an SOI transistor in accordance with the thirteenth preferred embodiment of the present invention. FIG. 29 is a cross section of FIG. 28 taken along the line XXIX—XXIX. In FIG. 29, layers below the SOI layer 106 (the buried oxide film 107 and the SI substrate 101) are omitted. The structure of FIG. 28 is characterized in that the main portion 109d of the gate electrode 109 is longer in the horizontal direction than that of FIG. 26 discussed in the twelfth preferred embodiment and most part of the end portion 109c is located outside the FS gate 91 (opposite to the first portion 106a), and a contact plug 83 to be connected to the end portion 109c is provided instead of the shared contact plug 80.

The contact plug 83 penetrates the interlayer film 82 and is brought into contact with the end portion 109c and the end portion 109c is in contact with a contact region 84 in the second portion 106b below the contact plug 83. Accordingly, the contact plug 83 is electrically connected to the second portion 106b through the end portion 109c.

This structure also establishes electrical connection between the gate electrode 109 and the body 110 and utilizes the parasitic bipolar effect with advantage. Naturally, the contact plug 83 may be provided in either of the two end portions 109c of one gate electrode 109.

Furthermore, it is necessary to avoid reversely-biased pn junction between the contact region 84 and end portion 109c. If the pn junction exists, the potential applied to the end portion 109c through the contact plug 83 is blocked by the pn junction and not supplied for the body 110.

For example, in FIG. 29 illustrating the NMOS transistor, when the gate electrode 109 is formed of $n^+$ semiconductor and the SOI layer 106 is formed of $p^-$ semiconductor, the reversely-biased pn junction is formed between the contact region 84 and the end portion 109c. To avoid this, it is desirable to locally increase an impurity concentration of the contact region 84 so that a tunnel current can go through the pn junction.

Another technique is implantation of heavy atoms, such as Si and Ar, to degrade the crystallinity of the SOI layer 106 in the contact region 84 so that a leak current may increase.

(C-5) The Fourteenth Preferred Embodiment

Figure 30:
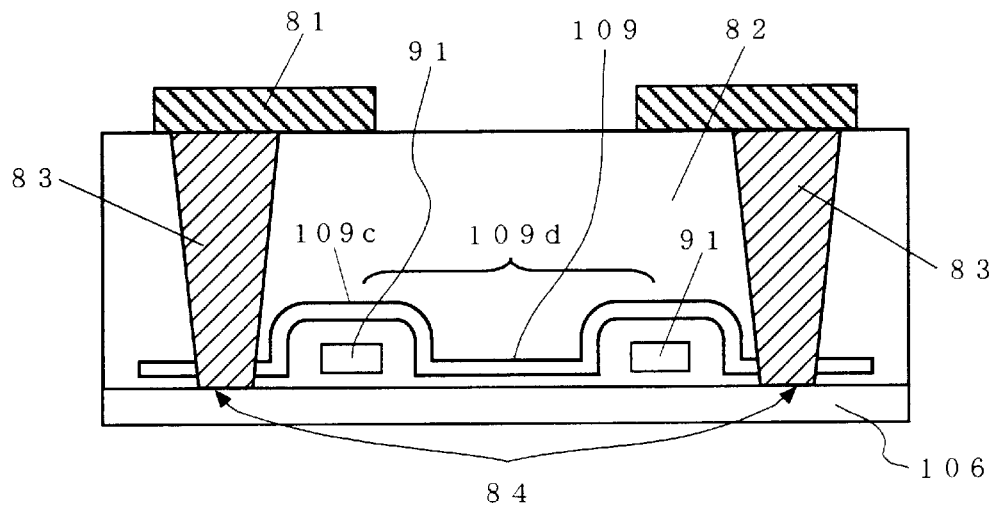
FIG. 30 is a cross section showing a fourteenth preferred embodiment of the present invention.

FIG. 30 is a cross section, corresponding to FIG. 29, showing an SOI transistor in accordance with the fourteenth preferred embodiment of the present invention. The structure of FIG. 30 is characterized in that the contact plug 83 penetrates not only the interlayer film 82 but also the gate electrode 109 in the structure of FIG. 29.

In this structure, the contact plug 83 is in contact with the contact region 84 of the second portion 106b while being in contact with the FS gate 91. Formed of tungsten and the like, the contact plug 83 establishes a Shottky junction with the SOI layer 106 in the contact region 84. For example, if the Shottky junction is established in the NMOS transistor, the potential at the body 110 can be suppressed even if high potential is applied to the gate electrode 109.

Without this suppression, the potential at the body 110 may be too much higher than those of the source and drain. That causes a large amount of electrons to flow into the body 110 from the source and drain. Once brought into this state, the electrons in the body 110 are not readily recombined with the positive holes even if the potential at the body 110 decreases. The time constant for the recombination is approximately 1 ns, for example. In a case where quick operation, e.g., switching operation of several tens ps, is required, such slow recombination may block the high-speed operation.

Therefore, establishment of the Shottky junction in the contact region 84 by direct contact between the contact plug 83 and the second portion 106b ensures the operation of the SOI transistor at much higher speed.

(C-6) The Fifteenth Preferred Embodiment

Figure 31:
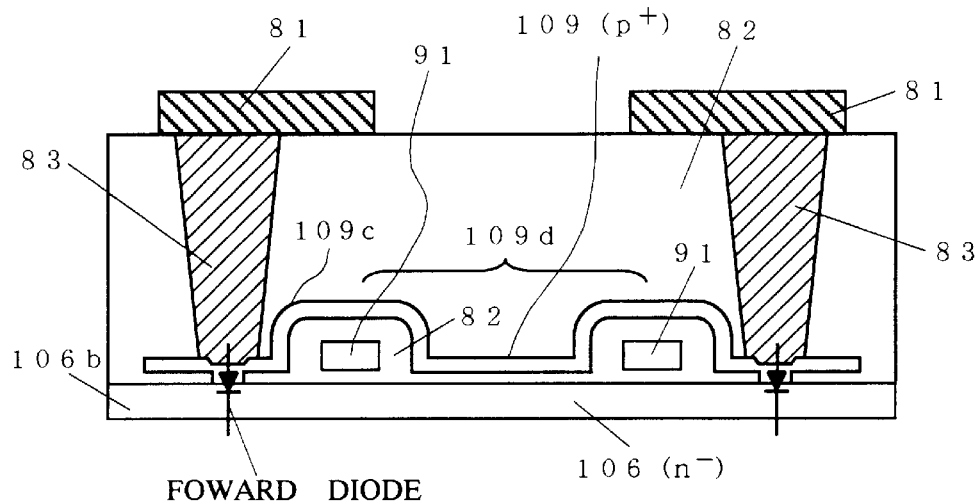
FIGS. 31 and 32 are cross sections showing a fifteenth preferred embodiment of the present invention.
Figure 32:
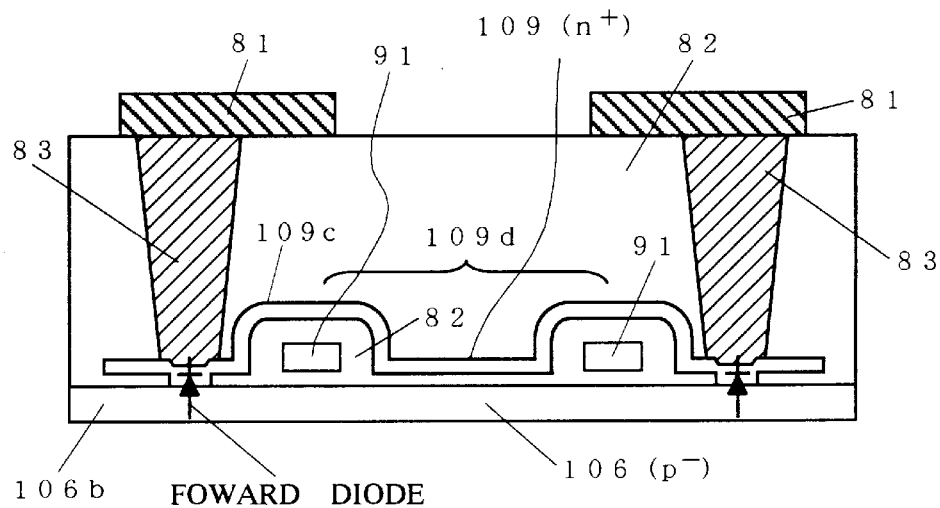

FIGS. 31 and 32 are cross sections, corresponding to FIG. 29, showing an NMOS transistor and a PMOS transistor of SOI transistor, respectively. Geometrical arrangement of FIGS. 31 and 32 are the same as that of FIG. 29. As shown in FIG. 31, in case of NMOS transistor, the SOI layer 106 is determined to have $n^-$-type conductivity type (which is the same as that of the channel formed in the SOI transistor) and the gate electrode 109 is formed of $p^+$-type semiconductor, and accordingly the pn junction established in the contact region 84 is forward biased.

Similarly, as shown in FIG. 32, in case of PMOS transistor, the SOI layer 106 is determined to have $p^-$-type conductivity type (which is the same as that of the channel formed in the SOI transistor) and the gate electrode 109 is formed of $n^+$-type semiconductor, and accordingly the pn junction established in the contact region 84 is forward biased.

This structure avoids a situation where the potential applied to the end portion 109c through the contact plug 83 is blocked by the pn junction and not supplied for the body 110.

Furthermore, if such conductivity type as discussed in this preferred embodiment is used, the transistors arranged in the vertical direction are pn-isolated. For example, if the gate potential in the NMOS transistor is 0 V, the reversely-biased pn junction is included between the source and drain since the channel is inverted by the difference of work functions between the gate and the body.

(C-7) The Sixteenth Preferred Embodiment

Figure 33:
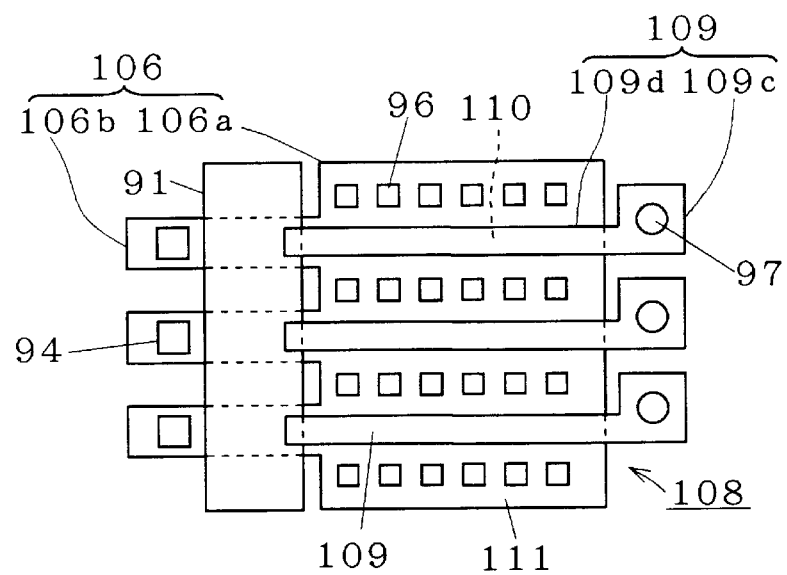
FIG. 33 is a plan view showing a sixteenth preferred embodiment of the present invention.

FIG. 33 is a plan view showing an SOI transistor in accordance with the sixteenth preferred embodiment of the present invention. The SOI transistor 106 includes the first portion 106a extending in the vertical direction in which the active region 111 is formed and a plurality of second portions 106b extending from the first portion 106a in the horizontal direction discretely from each other. Unlike the preferred embodiments discussed earlier, the second portions 106b are provided only on the left side of the figure. The gate electrode 109 is provided above the SOI layer 106 and the main portion 109d covers part of the first portion 106a in the horizontal direction.

The end portion 109c is provided only on the right side of the main portion 109d and accordingly the second portion 106b is not covered with the end portion 109c. The gate contact 97 is provided in the end portion 109c.

Perpendicularly to this paper, the FS gate 91 is provided between the gate electrode 109 and the SOI layer 106, being insulated therefrom, and covers part of the second portion 106b and the left end (on the side where the end portion 109c is not provided) of the main portion 109d of the gate electrode 109 in the vertical direction.

The body contact 94 is provided in the second portion 106b outside the FS gate 91 (opposite to the first portion 106a, on the left side in this figure).

In this structure, the body contact 94 and the gate contact 97 are separately provided opposite to each other with respect to the first portion 106a and therefore the area required for providing the contacts is reduced. Moreover, the body 110 may be brought into the floating state or may be connected to the gate electrode 109. When the body 110 is connected to the gate electrode 109, the body contact 94 and the gate contact 97 are separately connected with the wires.

Since no second portion 106b is provided on the side where the gate contact 97 is provided with respect to the first portion 106a, the LOCOS isolation may be used for device isolation on this side.

On the other hand, since the FS gate 91 is formed on the side where the body contact 94 is provided and no additional impurity is injected below that, the bodies 110 of the adjacent transistors are not short-circuited each other by the pn isolation.

Figure 34:
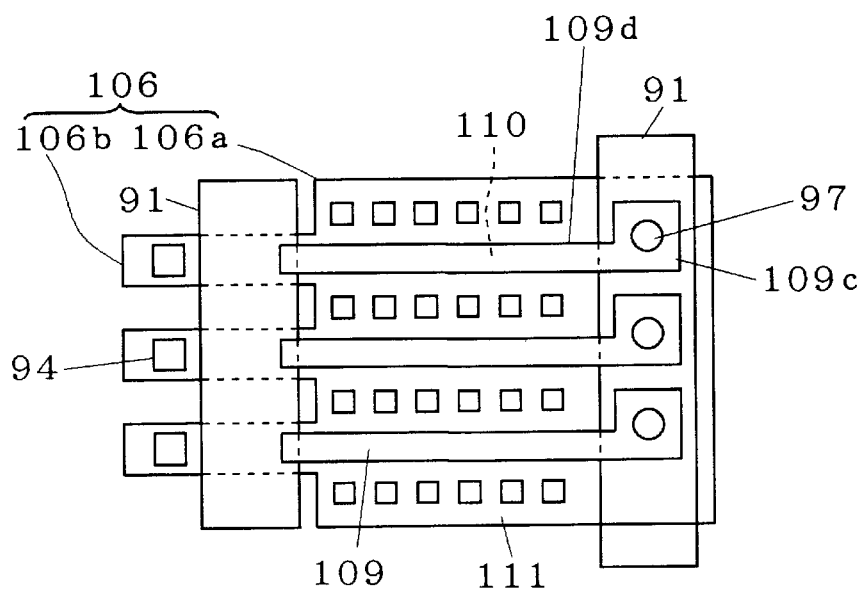
FIG. 34 is a plan view showing a variation in accordance with the sixteenth preferred embodiment of the present invention.

FIG. 34 is a plan view showing a variation in accordance with the sixteenth preferred embodiment. Instead of the LOCOS isolation in FIG. 33, the FS isolation may be used.

(C-8) The Seventeenth Preferred Embodiment

Figure 35:
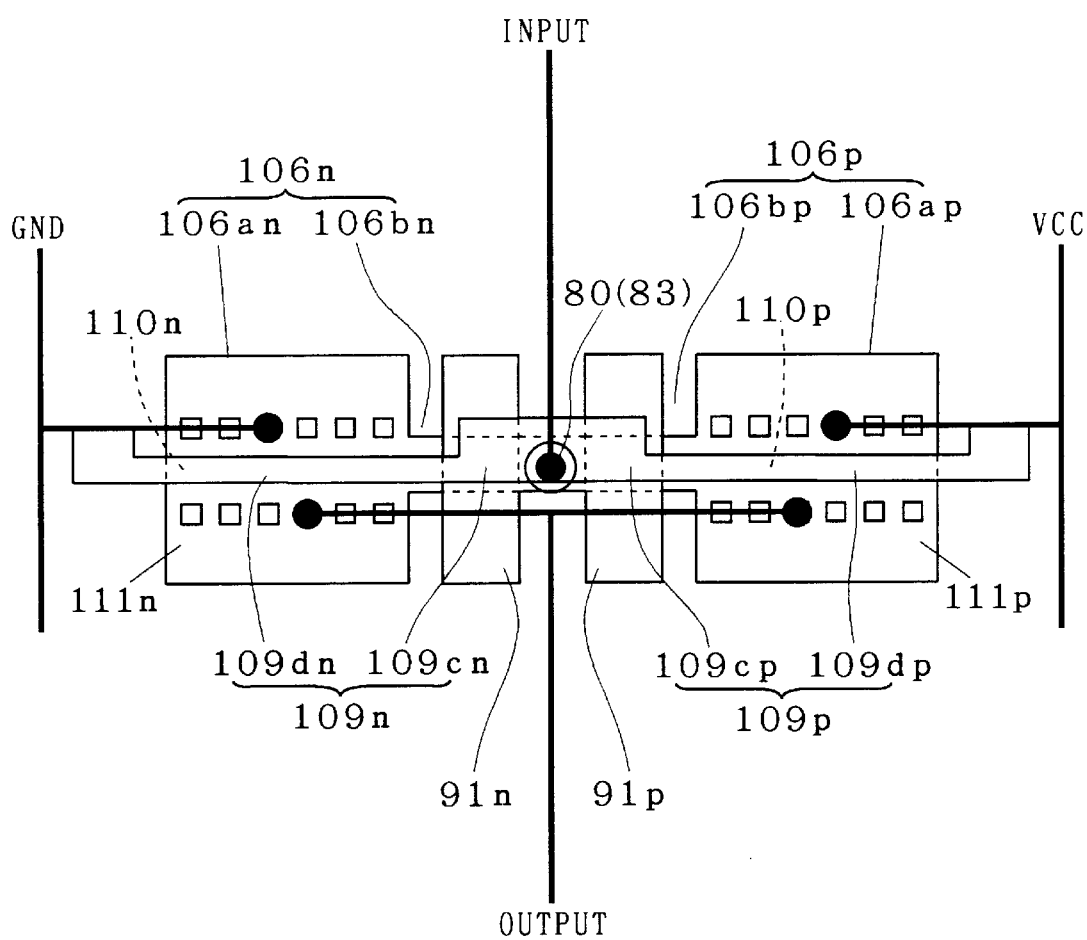
FIG. 35 is a plan view showing a seventeenth preferred embodiment of the present invention.
Figure 36:
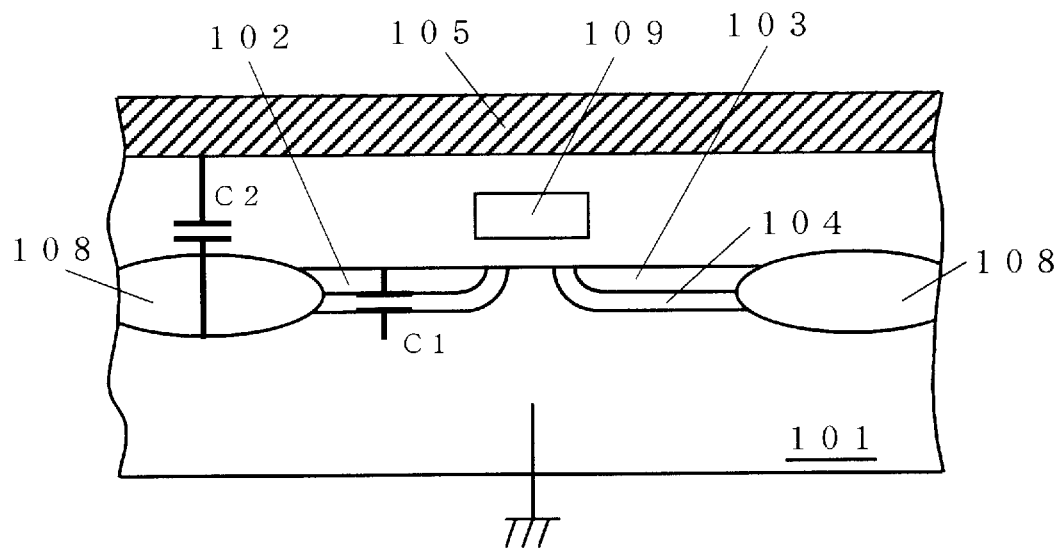
FIG. 36 is a cross section showing a structure of a bulk NMOS transistor.
Figure 37:
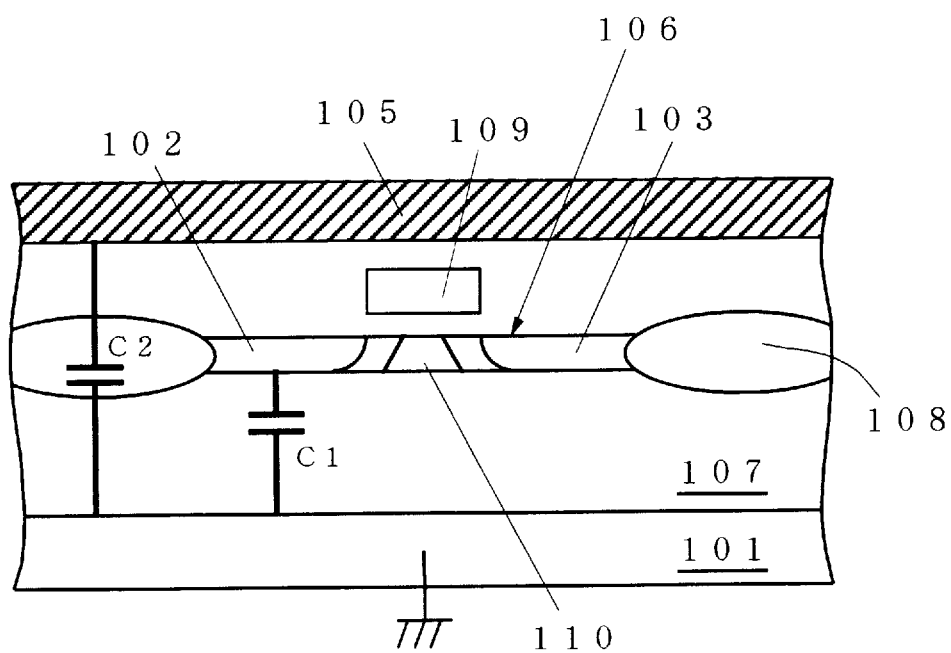
FIG. 37 is a cross section showing a structure of an SOI NMOS transistor.
Figure 38:
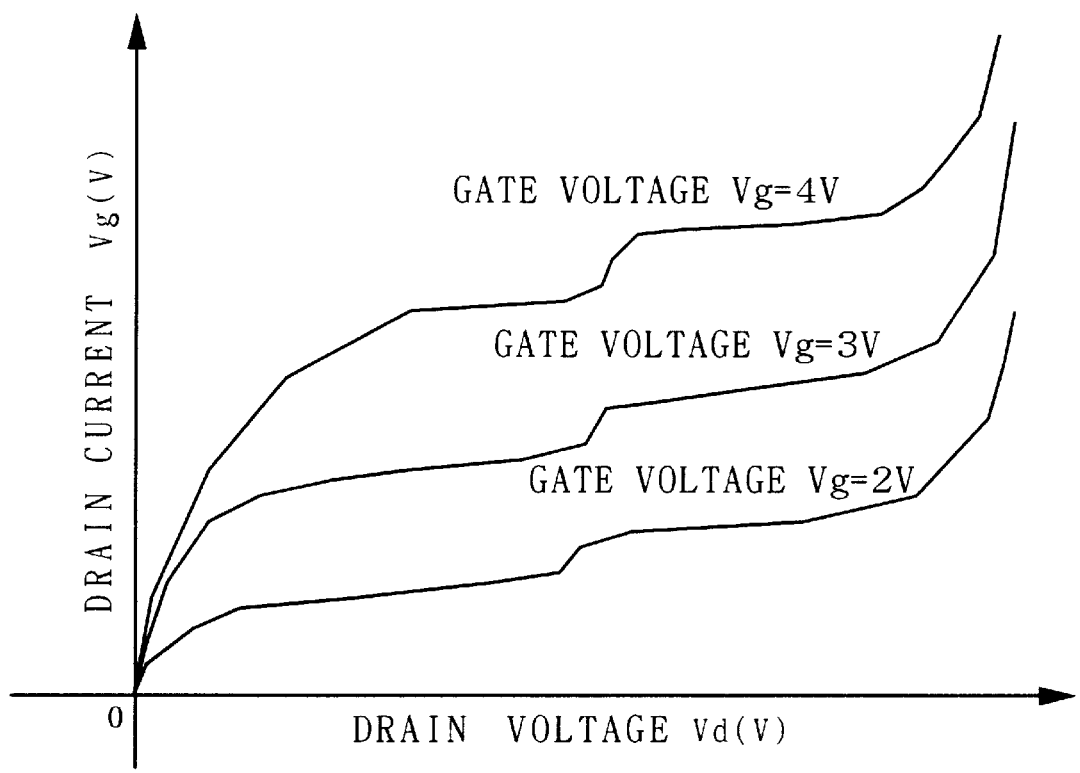
FIG. 38 is a graph showing a parasitic bipolar effect.

FIG. 35 is a plan view showing an SOI transistor in accordance with the seventeenth preferred embodiment of the present invention. In FIG. 35, an SOI layer 106n including the first portion 106an and the second portions 106bn and an SOI layer 106p including the first portion 106ap and the second portions 106bp are arranged in the horizontal direction. Part of the second portion 106bn is covered with an FS gate 91n and part of the second portion 106bp is covered with an FS gate 91p.

A main portion 109dn of a gate electrode 109n covers the first portion 106an in the horizontal direction and the covered first portion 106an serves as a body 110n. An end portion 109cn of the gate electrode 109n covers part of the second portion 106bn. Similarly, a main portion 109dp of a gate electrode 109p covers the first portion 106ap in the horizontal direction and the covered first portion 106ap serves as a body 110p. An end portion 109cp of the gate electrode 109p covers part of the second portion 106bp.

The second portions 106bn and 106bp are adjacently arranged and the end portions 109cn and 109cp are also adjacently arranged. The shared contact plug 80 discussed in the twelfth preferred embodiment is provided so as to come into contact with these portions in common. An input wire INPUT is connected to the shared contact plug 80.

An active region 111n of the first portion 106an is of n-type conductivity and an active region 111p of the first portion 106ap is of p-type conductivity.

One end of the active region 111n and one end of the active region 111p are connected in common to the output wire OUTPUT. The other end of the active region 111n is connected to the ground wire GND and the other end of the active region 111p is connected to a power supply wire Vcc.

Thus, the structure of FIG. 35 forms an inverter, where the NMOS transistor consisting of the gate electrode 109n and the active region 111n and the PMOS transistor consisting of the gate electrode 109p and the active region 111p are connected in series between the power supply wire Vcc and the ground wire GND.

Since one shared contact plug 80 can connect the gate electrodes 109n and 109p and the bodies 110n and 110p in common, there is no need for a construction to separately define the potentials for the respective bodies of the NMOS transistor and PMOS transistor and a construction to connect the gates of the two transistors to each other. In other words, the area required to form the inverter can be reduced.

The layout of the seventeenth preferred embodiment is more suitable for a full-custom IC than a gate array.

Naturally, the contact plug 83 discussed in the thirteenth preferred embodiment may be used, instead of the shared contact plug 80. Further, there may be an arrangement where the gate electrodes 109n and 109p come into contact with the second portions 106bn and 106bp, respectively, and the input wire INPUT is connected to the gate electrodes 109n and 109p. In these cases, the area required to form the inverter can be also reduced.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
   at least one first-type field extending in a first direction; and
   at least one second-type field extending in said first direction;
   wherein the at least one first-type field and the at least one second-type field constitute a gate array in which SOI transistors are provided, the at least one first-type field supplies bodies of said SOI transistors with a fixed potential, the at least one second-type field brings said bodies of said SOI transistors into a floating state, and the at least one first-type field and the at least one second-type field are arranged along a second direction which is different from said first direction.

2. The semiconductor device of claim 1, wherein the at least one first-type field is isolated using a field-shield isolation.

3. The semiconductor device of claim 1, wherein the at least one first-type field comprises a pair of the first-type fields which are different in conductivity type from each other and the at least one second-type field is located therebetween, and the pair of first-type fields and the at least one second-type field are arranged as a set.

4. The semiconductor device of claim 1, wherein a PMOS transistor is provided only in the at least one second-type field and an NMOS transistor is provided both in the at least one first-type field and in the at least one second-type field.

5. The semiconductor device of claim 1, wherein the at least one second-type field is narrower than the at least one first-type field.

6. The semiconductor device of claim 1, wherein the at least one first-type field and said at least one second-type field which are of a different conductivity are alternately arranged while the at least one first-type field and the at least one second-type field which are of a same conductivity type are adjacently arranged.

7. The semiconductor device of claim 1, wherein said gate array consists of a plurality of clusters, each of said plurality of clusters includes a first subarray having the at least one first-type field and the at least one second-type field, and a second subarray having only the at least one first-type field, and said first subarray is different in length from said second subarray along said first direction.

8. A semiconductor device, comprising:
   an SOI layer having a first portion extending in a first direction and a plurality of second portions extending from said first portion and disposed discretely in a second direction which is different from said first direction;
   gate electrodes each having an end portion which covers part of the plurality of second portions in said first direction and a main portion which extends from said end portion and covers part of said first portion in said second direction;
   bodies each of a first conductivity type provided in said first portion which is covered with said main portion; and
   active regions each of a second conductivity type provided in said first portion which is not covered with said main portion;
   wherein a pair of said active regions and one of said gate electrodes constitute an SOI transistor.

9. A semiconductor device, comprising:
   an SOI layer having a first portion extending in a first direction and a plurality of second portions extending from said first portion and disposed discretely in a second direction which is different from said first direction;
   gate electrodes each having a main portion which covers part of said first portion in said second direction;
   bodies each of a first conductivity type provided in said first portion which is covered with said main portion;
   active regions each of a second conductivity type provided in said first portion which is not covered with said main portion; and
   isolation electrodes covering part of the plurality of second portions in said first direction and insulated from one another between said SOI layer and said gate electrodes;
   wherein a pair of said active regions and one of said gate electrodes constitute an SOI transistor.

10. A semiconductor device, comprising:
    SOI layers disposed discretely in a first direction, each having a first portion and a second portion which are contiguous in a second direction different from said first direction;
    gate electrodes each having a main portion which covers part of said first portion in said second direction;
    bodies each of a first conductivity type provided in said first portion which is covered with said main portion;
    active regions each of a second conductivity type provided in said first portion which is not covered with said main portion; and
    an isolation electrode covering part of said second portion in said first direction and insulated between said SOI layer and said gate electrodes;
    wherein a pair of said active regions and one of said gate electrodes constitute an SOI transistor.

11. The semiconductor device of claim 8, further comprising:
    wires for electrically connecting said gate electrodes and said second portions provided corresponding to said gate electrodes.

12. A semiconductor device, comprising:
    an SOI layer having a first portion extending in a first direction and at least one second portion extending from said first portion in a second direction which is different from said first direction;
    a gate electrode having a main portion which covers part of said first portion in said second direction while being insulated therefrom and an end portion which covers part of the at least one second portion while being insulated therefrom with an interlayer film;
    a body of a first conductivity type provided in said first portion which is covered with said main portion;
    active regions each of a second conductivity type provided in said first portion which is not covered with said main portion; and
    plugs each penetrating said interlayer film to come into contact with the at least one second portion and said end portion which correspond to each other;
    wherein a pair of said active regions and said gate electrode constitute an SOI transistor.

13. The semiconductor device of claim 12, wherein said plugs come into contact with said at least one second portion while penetrating said at least one second portion.

14. A semiconductor device, comprising:

an SOI layer having a first portion extending in a first direction and at least one second portion extending from said first portion in a second direction which is different from said first direction;

a gate electrode having a main portion which covers part of said first portion in said second direction while being insulated therefrom and an end portion;

a body of a first conductivity type provided in said first portion which is covered with said main portion;

active regions each of a second conductivity type provided in said first portion which is not covered with said main portion; and plugs each coming into contact with said end portion;

wherein a pair of said active regions and said gate electrode constitute an SOI transistor.

15. The semiconductor device of claim 14, wherein a contact region in the at least one second portion, being in contact with said end portion, has a higher impurity concentration.

16. The semiconductor device of claim 14, wherein a contact region in the at least one second portion, being in contact with said end portion, has a degraded crystallinity.

17. The semiconductor device of claim 14, wherein said SOI layer is determined to have the same conductivity type as a channel to be formed in said SOI transistor, and said gate electrode is formed of a semiconductor of a conductivity type which is different from that of said SOI layer.

18. A semiconductor device, comprising:

an SOI layer having a first portion extending in a first direction and at least one second portion extending from one end of said first portion in a second direction which is different from said first direction;

a gate electrode having a main portion which covers part of said first portion in said second direction while being insulated therefrom and an end portion covering the other part of said first portion;

a body of a first conductivity type provided in said first portion which is covered with said main portion; and active regions each of a second conductivity type provided in said first portion which is not covered with said main portion;

wherein a pair of said active regions said gate electrode constitute an SOI transistor.

19. The semiconductor device of claim 18, wherein said at least one second portion comprises a plurality of second portions provided discretely in said first direction, and said semiconductor device further comprises an isolation electrode covering part of said plurality of second portions in said first direction and insulated between said SOI layer and said gate electrode.

20. A semiconductor device, comprising:

a first SOI layer having a first portion extending in a first direction and a second portion extending from one end of said first portion in a second direction which is different from said first direction;

a first gate electrode having a main portion which covers part of said first portion in said second direction while being insulated therefrom and an end portion covering part of said second portion;

a first body provided in said first portion which is covered with said main portion;

first active regions of a first conductivity type provided in said first portion which is not covered with said main portion;

a second SOI layer having a first portion extending in said first direction and a second portion extending from one end of said first portion of said second SOI layer in said second direction;

a second gate electrode having a main portion which covers part of said first portion of said second SOI layer in said second direction while being insulated therefrom and an end portion covering part of said second portion of said second SOI layer;

a second body provided in said first portion of said second SOI layer which is covered with said main portion of said second gate electrode; and second active regions of a second conductivity type provided in said second portion of said second SOI layer which is not covered with said main portion of said second gate electrode;

wherein said second portion of said first SOI layer and said second portion of said second SOI layer are adjacently arranged, said end portion of said first gate electrode and said end portion of said second gate electrode are adjacently arranged, a pair of said first active regions and said first gate electrode constitute a first SOI transistor, a pair of said second active regions and said second gate electrode constitute a second SOI transistor, and said second portion of said first SOI layer, said second portion of said second said SOI layer, said end portion of said first gate electrode and said end portion of said second gate electrode are connected in common at one portion in a plane having said first and second directions.

21. An electronic circuit, comprising:

a first MOS transistor having a first current electrode at which a potential is fixed and a second current electrode; and a second MOS transistor having a first current electrode being connected to said second current electrode of said first MOS transistor and a second current electrode at which a potential is floating;

wherein a potential at a body of said first MOS transistor is fixed and a potential at a body of said second MOS transistor is floating.

22. The electronic circuit of claim 21, wherein said body of said second MOS transistor is connected to said first current electrode of said second MOS transistor.

* * * * *